(12) United States Patent
Kihara et al.

(10) Patent No.: US 7,833,000 B2
(45) Date of Patent: *Nov. 16, 2010

(54) OPTICAL MODELING APPARATUS

(75) Inventors: Nobuhiro Kihara, Kanagawa (JP); Masanobu Yamamoto, Kanagawa (JP); Kimihiro Saito, Saitama (JP); Yuichi Aki, Tokyo (JP); Takeshi Yamasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

This patent is subject to a terminal disclaimer.

(21) Appl. No.: 11/963,058

(22) Filed: Dec. 21, 2007

(65) Prior Publication Data

US 2008/0169587 A1 Jul. 17, 2008

(30) Foreign Application Priority Data

Dec. 22, 2006 (JP) .............................. 2006-346577

(51) Int. Cl.
*H05B 6/00* (2006.01)
(52) U.S. Cl. .................... 425/174.4; 264/492; 264/494; 264/401; 264/497; 700/118; 700/119; 700/120
(58) Field of Classification Search ................. 425/375, 425/174.4; 264/408, 492, 494, 401, 497; 359/10, 583; 700/118–120
See application file for complete search history.

(56) References Cited

U.S. PATENT DOCUMENTS

| | | | | |
|---|---|---|---|---|
| 5,287,435 A | | 2/1994 | Cohen et al. | |
| 5,353,155 A | * | 10/1994 | Miller | 359/618 |
| 5,933,230 A | * | 8/1999 | Imaino et al. | 356/237.2 |
| 6,393,219 B1 | * | 5/2002 | Sensui | 396/114 |
| 6,500,378 B1 | * | 12/2002 | Smith | 264/401 |
| 6,882,469 B2 | * | 4/2005 | Tamaki et al. | 359/348 |
| 6,899,440 B2 | * | 5/2005 | Bierhuizen | 362/19 |
| 7,463,394 B2 | * | 12/2008 | Shechterman | 359/211.1 |
| 2005/0286115 A1 | * | 12/2005 | Aubuchon et al. | 359/291 |

FOREIGN PATENT DOCUMENTS

| | | |
|---|---|---|
| JP | 5-77323 | 3/1993 |
| JP | 2001-297976 | 10/2001 |

OTHER PUBLICATIONS

U.S. Appl. No. 11/953,388, filed Dec. 10, 2007, Kihara, et al.

* cited by examiner

*Primary Examiner*—Khanh Nguyen
*Assistant Examiner*—Saeed M Huda
(74) *Attorney, Agent, or Firm*—Oblon, Spivak, McClelland, Maier & Neustadt, L.L.P.

(57) ABSTRACT

There is provided an optical modeling apparatus that forms a model of a desired shape by sequentially forming hardened layers by irradiating a light-curable resin with light. The apparatus includes a first light source that emits a light beam for plotting on the resin, a scanning device that scans the light beam from the first light source over the resin, a second light source that emits light that irradiates one fixed region of the resin at a time, and a spatial light modulator that spatially modulates the light from the second light source to blanket-expose a specified region of the resin. The light beam from the scanning device and the light from the spatial light modulator form each hardened layer.

16 Claims, 11 Drawing Sheets

OPTICAL MODELING APPARATUS

CROSS REFERENCE TO RELATED APPLICATION

The present invention contains subject matter related to Japanese Patent Application JP 2006-346577 filed in the Japan Patent Office on Dec. 22, 2006, the entire contents of which being incorporated herein by reference.

BACKGROUND OF THE INVENTION

1. Field of the Invention

The present invention relates to an optical modeling apparatus that forms a resin model of a desired shape by exposing a light-curable resin such as an ultraviolet-curable resin or the like to light to form a hardened layer, then stacking the hardened layers to form the model.

2. Description of the Related Art

In recent years, a technique called rapid prototyping has become a focus of attention in many manufacturing environments. Rapid prototyping uses three-dimensional shape data that is input from a CAD device to create a three-dimensional model of a target shape without doing any machining or the like.

Methods that are known as rapid prototyping techniques include optical modeling that uses an ultraviolet-curable resin, fused deposition modeling (FDM), in which a thermoplastic resin is extruded and the extruded thermoplastic resin is layered, selective laser sintering (SLS), in which a powder is fused, bonded, and layered, laminated object manufacturing (LOM), in which thin paper films are layered, the ink jet method, in which a powder and an effective catalyst are discharged and layered, and the like.

Known three-dimensional modeling methods form a model of a desired three-dimensional shape through the process flow described below. Specifically, the first step is to use a computer or the like to input and design a target three-dimensional shape (three-dimensional shape data) created by a CAD device that is a three-dimensional design system.

Next, the CAD data that is input is converted to specified three-dimensional shape data in the STL format or the like. The orientation in which the model is positioned (upright, inverted, sideways, or the like) and the layering direction are determined. The model is then sliced into cross sections with a thickness of approximately 0.1 to 0.2 millimeters in the layering direction, and cross section data is created for each layer.

A three-dimensional model can then be produced, based on the cross section data for each layer, by changing a property of a material such as a liquid light-curable resin, a powdered resin, a metal powder, a wax, or the like, one layer at a time, starting with the lowermost layer, and building up the layers.

Specifically, using the case of the liquid light-curable resin as an example, first, a hardened layer of a specified thickness that becomes the first layer is formed on a moving platform that moves in a direction perpendicular to the surface of the liquid. Next, after the moving platform is moved downward, another hardened layer of a specified thickness is formed on top of the first hardened layer. Additional hardened layers are formed successively in the layering direction, with each nth hardened layer being formed on top of the (n−1)th hardened layer such that the three-dimensional model is produced.

A modeling apparatus that produces a three-dimensional model by a three-dimensional modeling method like that described above can easily produce a three-dimensional shape that has a free-form surface or a complex structure that is difficult to produce by cutting in a three-dimensional modeling method that uses machining. Moreover, the modeling apparatus can produce the desired three-dimensional shape (model) by a completely automated process that does not generate tool wear, noise, vibration, cutting debris, and the like, as is necessary with machining.

In order for this sort of useful three-dimensional modeling technology to be applied in a wide variety of fields, for example, in the manufacture of high-resolution resin moldings with external dimensions measuring from several millimeters to several centimeters and degrees of precision in the range of several microns, modeling with still higher resolution and speed is desirable.

SUMMARY OF THE INVENTION

However, the degree of precision of the known three-dimensional modeling methods and three-dimensional modeling apparatuses, due to the purposes for which they were originally used, is generally no better than around 50 microns. When an effort is made to improve the precision to the range of several microns, for example, an enormous amount of modeling time is required, and it is difficult to produce a model of a large region. In other words, it is extremely difficult to produce a comparatively large model with high resolution.

For example, modeling apparatuses that use a light-curable resin such as a known ultraviolet-curable resin or the like, such as the modeling apparatus disclosed in Japanese Patent Application Publication No. JP-A-5-77323, include those that use a beam scanning method and those that use a blanket exposure method.

A modeling apparatus that uses the beam scanning method has a beam scanning optical system that uses a light beam that emanates from a light source, such as a laser beam or the like, to do the scanning. The optical system performs three-dimensional modeling by scanning the ultraviolet-curable resin and plotting the desired shape one layer at a time, based on the sliced cross section shape data described above, so as to form each hardened layer, then accumulating the layers. Note that the beam scanning method is one of raster scanning, vector scanning, and combined raster-vector scanning. Raster scanning, as shown in FIG. 6A, plots the cross section shape by reciprocating linear scanning in one direction at a time. Vector scanning, as shown in FIG. 6B, scans in a curved line in order to mitigate the difficulty of plotting edge portions (boundary portions) smoothly, which is a shortcoming of raster scanning. Combined raster-vector scanning, as shown in FIG. 6C, utilizes the strengths of both raster scanning and vector scanning by using vector scanning only to plot edge portions.

The modeling apparatus that uses the beam scanning method as described above can perform high-resolution modeling by modifying factors such as the wavelength used and the configuration of the lens system in order to narrow the diameter of the beam. However, there is a limit to the intensity of the light source, and because the shape is basically plotted by scanning with a single light beam, an extremely long period of time is required in order to expose a comparatively large region to the light beam so that a hardened layer with a large surface area can be formed. In addition, in the known modeling apparatuses, the configurations of the optical systems limit the scanning range of the light beam, which imposes a limit on the formation of a hardened layer for a large region.

A modeling apparatus that uses the blanket exposure method has a spatial light modulator (SLM) projection optical system that has a spatial light modulator such as a liquid crystal panel, a DMD, or the like. The optical system performs three-dimensional modeling by projecting onto the ultraviolet-curable resin a pattern for each layer that is displayed by the spatial light modulator according to the sliced cross section shape data described above, so as to form each hardened layer, then accumulating the layers.

The modeling apparatus that uses the blanket exposure method can use an array type of light source, for example, because it does not plot the shape by beam scanning with a single light beam. The light source can thus be made more intense, and the exposure time can be shortened. However, because the degree of precision is determined by the number of pixels or the like in the spatial light modulator, there is a limit on the precision. Thus the edge portions in each hardened layer cannot be clearly formed, and high-resolution modeling is difficult.

The present invention provides an optical modeling apparatus and an optical modeling method that can perform high-precision optical modeling at high speed.

According to an embodiment of the present invention, there is provided an optical modeling apparatus that forms a model of a desired shape by sequentially forming hardened layers by irradiating a light-curable resin with light. The optical modeling apparatus includes: a first light source that emits a light beam for plotting on the light-curable resin; a scanning device that scans the light beam emitted by the first light source over the light-curable resin; a second light source that emits light that irradiates one fixed region of the light-curable resin at a time; and a spatial light modulator that spatially modulates the light emitted by the second light source to perform a blanket exposure of a specified region of the light-curable resin. Each of the hardened layers of the model is formed by the light beam that is scanned by the scanning device and by the light that is spatially modulated by the spatial light modulator.

According to another embodiment of the present invention, there is provided an optical modeling method that forms a model of a desired shape by sequentially forming hardened layers by irradiating a light-curable resin with light. The optical modeling method includes the steps of: emitting from a first light source a light beam for plotting on the light-curable resin; using a scanning device to scan the light beam emitted from the first light source; emitting from a second light source light that irradiates one fixed region of the light-curable resin at a time; using a spatial light modulator to spatially modulate the light emitted from the second light source; and forming each of the hardened layers of the model by using the light beam that is scanned by the scanning device to perform plotting on the light-curable resin and by using the light that is spatially modulated by the spatial light modulator to perform a blanket exposure of a specified region of the light-curable resin.

According to another embodiment of the present invention, there is provided an optical modeling method that forms a model of a desired shape by sequentially forming hardened layers by irradiating a light-curable resin with light, based on three-dimensional shape data that is input from an input portion. The optical modeling method includes the steps of: inputting the three-dimensional shape data from the input portion; creating two-dimensional shape data for each layer based on the three-dimensional shape data that is input; creating, based on the two-dimensional shape data, a first data for forming a specified region of the hardened layer by using a spatial light modulator to perform a blanket exposure of the light-curable resin, and a second data for forming a remaining region of the hardened layer by using a scanning device to scan a light beam over the light-curable resin; and sequentially forming the hardened layers by using the spatial light modulator to spatially modulate light and perform the blanket exposure of a specified region of the light-curable resin, based on the first data, and by using the scanning device to scan the light beam over the light-curable resin, based on the second data.

According to another embodiment of the present invention, there is provided an optical modeling method that forms, on a moving platform that is immersed in a light-curable resin and is moved in at least a direction that is orthogonal to a surface of the light-curable resin, a model of a desired shape by sequentially forming hardened layers by irradiating the light-curable resin with light, based on three-dimensional shape data that is input from an input portion. The optical modeling method includes the steps of: inputting the three-dimensional shape data from the input portion; creating two-dimensional shape data for each layer based on the three-dimensional shape data that is input; creating, based on the two-dimensional shape data for each layer, segmented region shape data for each of a plurality of segmented regions that segment each layer within a plane that is parallel to the surface of the light-curable resin; creating, based on the segmented region shape data, a first data for forming a specified region of the segmented region of the hardened layer by using a spatial light modulator to perform a blanket exposure of the light-curable resin, and a second data for forming a remaining region of the segmented region of the hardened layer by using a scanning device to scan a light beam over the light-curable resin; and sequentially forming the hardened layers that are produced by forming each segmented region by using the spatial light modulator to spatially modulate light and perform the blanket exposure of a specified region of the light-curable resin, based on the first data, and by using the scanning device to scan the light beam over the light-curable resin, based on the second data, and by sequentially changing a positional relationship between the moving platform and the spatial light modulator and the scanning device within the plane that is parallel to the surface of the light-curable resin.

According to the embodiments of the present invention described above, each hardened layer is formed by using the light beam that is scanned by the scanning device and the light that is spatially modulated by the spatial light modulator to harden the light-curable resin, thus forming a high-resolution three-dimensional model in a short time.

DETAILED DESCRIPTION OF THE PREFERRED EMBODIMENTS

Figure 1:
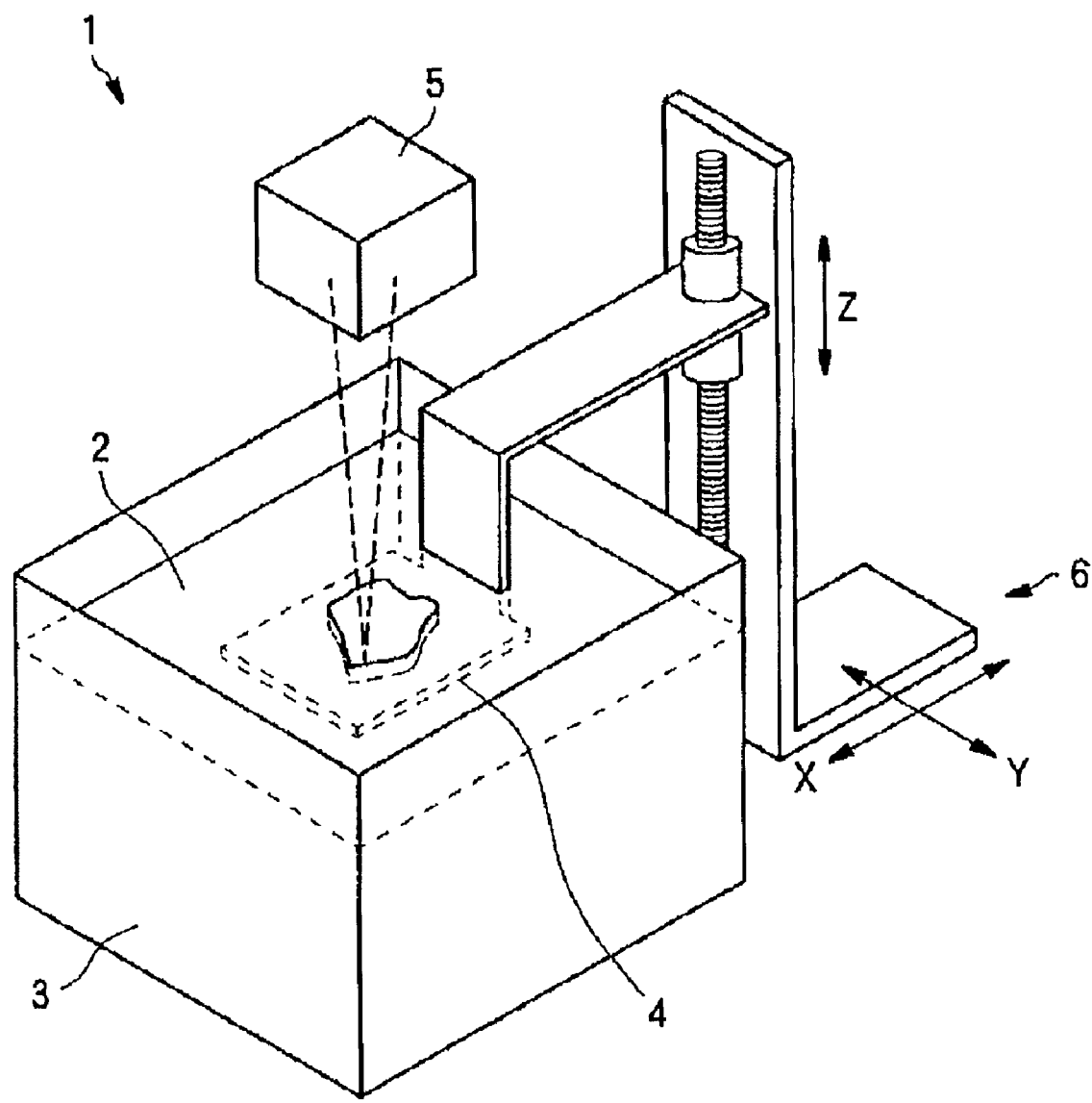
FIG. 1 is an oblique view that shows an overview of an optical modeling apparatus according to an embodiment of the present invention.

Hereinafter, a preferred embodiment of the present invention will be described in detail with reference to the appended drawings. Note that, in this specification and the appended drawings, structural elements that have substantially the same function and structure are denoted with the same reference numerals, and repeated explanation of these structural elements is omitted.

An optical modeling apparatus 1 according to an embodiment of the present invention, as shown in FIG. 1, is an optical modeling apparatus that forms a series of hardened layers by exposing a light-curable resin to light, accumulating the layers to form a model of a desired shape. Note that the embodiment explained below uses a liquid ultraviolet-curable resin as the light-curable resin, but the present invention is not limited to using a liquid resin. For example, a resin film may also be used. Moreover, the present invention is not limited to using an ultraviolet-curable resin. That is, the light-curable resin may be any material that forms a hardened layer by being exposed to light.

Specifically, the optical modeling apparatus 1 includes a reservoir 3, a moving platform 4, and an optical system 5. The reservoir 3 contains a liquid ultraviolet-curable resin 2 as the light-curable resin. The moving platform 4 is immersed in the reservoir 3 and can move in a vertical direction Z that is orthogonal at least to a liquid surface that is the surface of the ultraviolet-curable resin 2. The optical system 5 has a beam scanning optical system and a blanket exposure optical system that are described later and that expose the ultraviolet-curable resin 2 to light. The optical modeling apparatus 1 performs three-dimensional modeling by repeating a sequence of two operations. The first operation forms a hardened layer of the ultraviolet-curable resin 2 on the moving platform 4 by using the optical system 5 to expose the ultraviolet-curable resin 2 to light. The second operation moves the moving platform 4 downward in the vertical direction Z. The optical modeling apparatus 1 also uses a moving section 6 that is described later to change the relative positions of the moving platform 4 and the optical system 5 in a horizontal plane. This makes it possible to form a hardened layer with a larger surface area than the region over which a hardened layer can be formed when the relative positions of the moving platform and the optical system 5 are fixed. That is, the optical modeling apparatus 1 is able to form a larger model.

Figure 2:
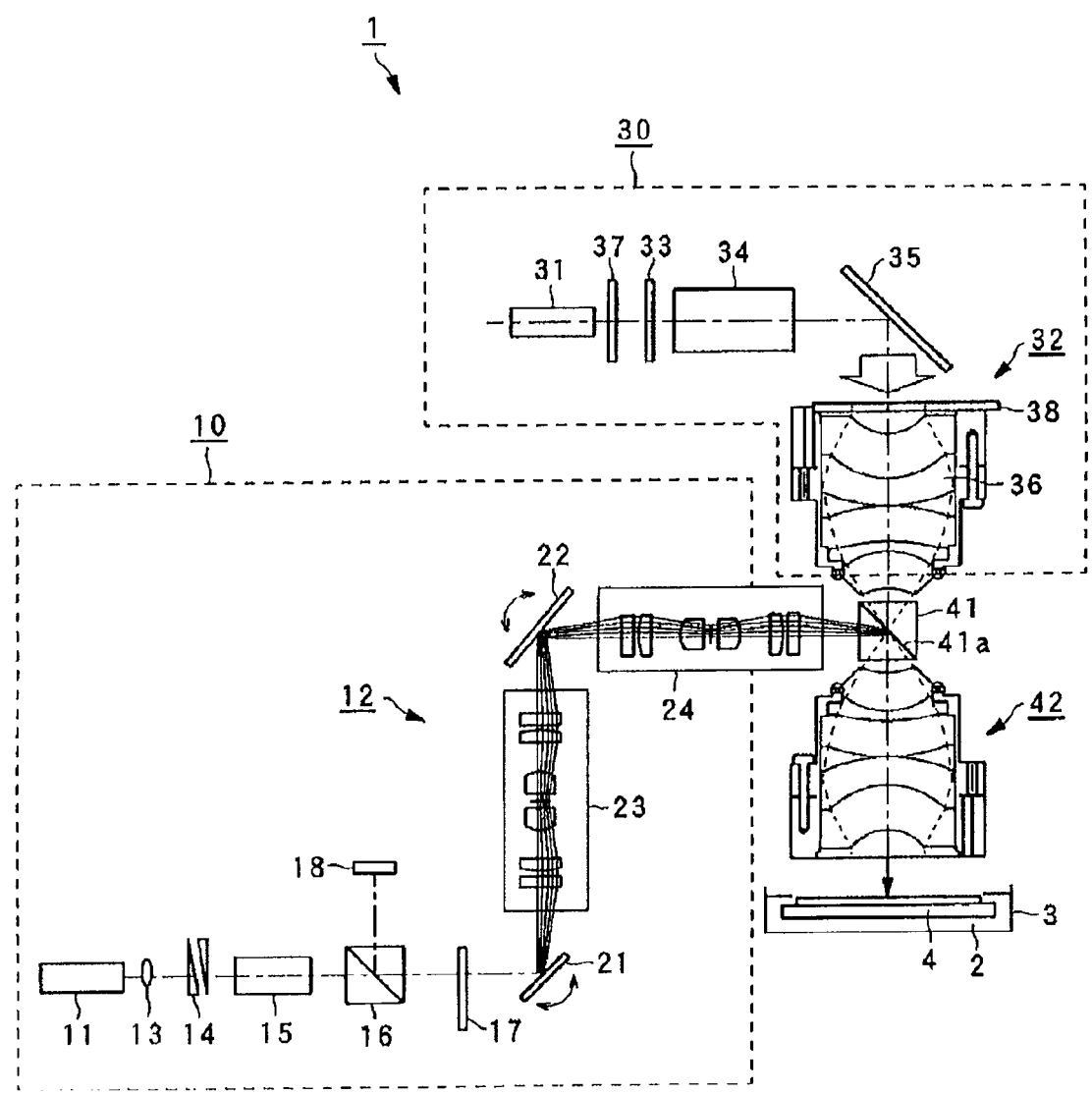
FIG. 2 is a figure that shows an optical system of the optical modeling apparatus according to the embodiment of the present invention.

As shown in FIG. 2, the optical modeling apparatus 1 includes the beam scanning optical system 10 and the blanket exposure optical system 30. The beam scanning optical system 10 includes a first light source 11 and a scanning device 12 for the beam scanning optical system 10. The first light source 11 is a beam scanning light source that emits a light beam that plots light on the ultraviolet-curable resin 2. The scanning device 12 scans the light beam emitted by the first light source 11 over the ultraviolet-curable resin 2. The blanket exposure optical system 30 includes a second light source 31 and a spatial light modulator 32 for the blanket exposure optical system 30. The second light source 31 is a blanket exposure light source that emits light that irradiates one fixed region of the ultraviolet-curable resin 2 at a time. The spatial light modulator 32 causes a specified region of the ultraviolet-curable resin 2 to be subjected to a blanket exposure of the light emitted from the second light source 31. The optical modeling apparatus 1 is also provided with a beam splitter 41 that serves as a light path combiner that combines the light beam from the scanning device 12 and the spatially modulated light from the spatial light modulator 32 and guides the light onto the ultraviolet-curable resin 2.

In addition to the first light source 11 and the scanning device 12 described above, the optical modeling apparatus 1 includes, as parts of the beam scanning optical system 10, a collimator lens 13, an anamorphic lens 14, and a beam expander 15. The collimator lens 13 converts the divergence angle of the light beam emitted by the first light source 11 to form a roughly parallel light beam. The anamorphic lens 14 forms the roughly elliptical light beam emerging from the collimator lens 13 into a roughly circular shape. The beam expander 15 performs a beam diameter size adjustment, converting the beam diameter of the light beam that emerges from the anamorphic lens 14 to a desired beam diameter that is suitable for an aperture of an objective lens 42 that is described later, a numerical aperture (NA), or the like.

In the present embodiment, a beam splitter 16 and a shutter 17 are provided between the beam expander 15 and a first galvano-mirror 21 that is described later. The beam splitter 16, in addition to transmitting the light beam that is emitted from the first light source 11, guides the returning light that is reflected by the ultraviolet-curable resin 2 to a reflected light detector 18, described later, that detects the returning light. The shutter 17 controls whether the light beam that irradiates the ultraviolet-curable resin 2 passes through or is blocked. That is, the shutter 17 controls the on-off status of plotting by the beam scanning optical system 10.

The first light source 11, which serves as the beam scanning light source that is used by the beam scanning optical system 10, is, in this example, a semiconductor laser that that emits laser light of a comparatively short wavelength in the blue to ultraviolet range. Note that while the semiconductor laser is used in the present embodiment, the present invention is not limited by this and may also use a gas laser or the like. Because the semiconductor laser is used for the first light source 11 in the present embodiment, the collimator lens 13 is provided to form the roughly parallel light beam after the laser is emitted and the anamorphic lens 14 is provided to make the elliptical light beam circular. Note that, although the shutter 17 is provided in the presently described embodiment, using the semiconductor laser for the first light source 11 makes it possible to configure the beam scanning optical system 10 such that the on-off status of the light beam is controlled by directly modulating the laser beam.

The scanning device 12 of the optical modeling apparatus 1 includes, for example, the first galvano-mirror 21, a second galvano-mirror 22, and the objective lens 42. The first galvano-mirror 21 polarizes the light beam that strikes it from the beam expander 15 and scans in an X direction that is a first direction in a plane that is parallel to the liquid surface that is the surface of the ultraviolet-curable resin 2. The second galvano-mirror 22 polarizes the light beam that strikes it from the first galvano-mirror 21 and scans in a Y direction that is roughly orthogonal to the X direction and is a second direction in the plane that is parallel to the liquid surface of the ultraviolet-curable resin 2. The objective lens 42 is provided between the beam splitter 41 and the ultraviolet-curable resin 2. In addition to focusing the light beam from the second galvano-mirror 22, the objective lens 42 causes the light beam that was polarized by the first and second galvano-mirrors 21, 22 to scan over the ultraviolet-curable resin 2 at a constant speed.

The scanning device 12 also includes a first relay lens 23, which is provided between the first galvano-mirror 21 and the second galvano-mirror 22, and a second relay lens 24, which is provided between the second galvano-mirror 22 and the beam splitter 41.

Each of the first and second galvano-mirrors 21, 22 has a reflector, such as a mirror or the like, that is rotatable in a specified direction and an adjuster that adjusts the angle of the rotation direction of the reflector according to an electrical signal. In order to scan the light beam in the specified direction, each of the first and second galvano-mirrors 21, 22 reflects at a specified angle the light beam that strikes it, that is, polarizes the light beam in a desired direction, such that the light beam scans over the moving platform 4 in the intended plane (hereinafter also called the "working region"). Each of the first and second galvano-mirrors 21, 22 thus functions as a beam polarizer that polarizes the light beam. Note that in the description of the present embodiment, the beam scanning optical system 10 is configured such that the first galvano-mirror 21 scans the light beam in the X direction and the second galvano-mirror 22 scans the light beam in the Y direction, but the present invention is not limited to this configuration. The beam scanning optical system 10 may also be configured such that the scanning can be done along any two roughly orthogonal axes in the plane that is parallel to the liquid surface of the ultraviolet-curable resin 2, that is, in the intended plane on the moving platform 4. Moreover, the beam polarizers that are provided in the scanning device 12 and that respectively polarize the light beam in the two specified axial directions are not limited to the galvano-mirrors described above, but may also be polygon mirrors or the like.

The objective lens 42, which causes the light beam that is polarized by the first and second galvano-mirrors 21, 22 to scan over the ultraviolet-curable resin 2 at a constant speed, is a lens cluster that has at least one lens. The light beam that is respectively scanned in the X direction and the Y direction by the first and second galvano-mirrors 21, 22 and reflected by the beam splitter 41 enters the objective lens 42, which focuses it onto the ultraviolet-curable resin 2 to form an image. The objective lens 42 thus causes the light beam that is polarized by the first and second galvano-mirrors 21, 22 to scan over the ultraviolet-curable resin 2 at a constant scanning line speed. The objective lens 42 also causes the spatially modulated light from the blanket exposure optical system 30, described later, to form an image on the ultraviolet-curable resin 2.

Figure 3:
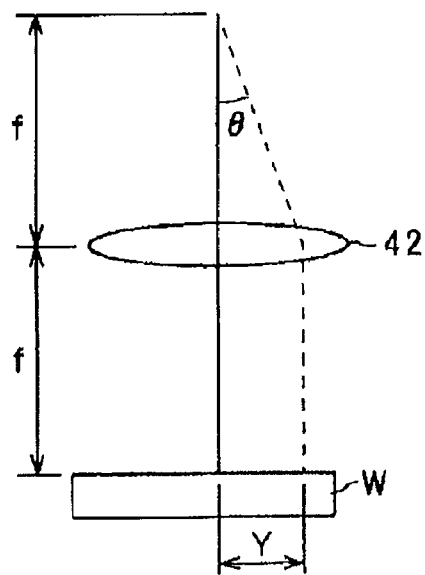
FIG. 3 is a schematic diagram that shows a first galvano-mirror and an objective lens and is a figure that is used to explain a function of the objective lens, the first galvano-mirror, and a second galvano-mirror, which are components of the optical modeling apparatus according to the embodiment of the present invention.

In the present embodiment, a so-called f$\theta$ lens is used for the objective lens 42. As shown in FIG. 3, the f$\theta$ lens has an image height Y that is proportional to an incidence angle $\theta$, such that the image height Y is equal to the product of a focal length f and the incidence angle $\theta$ ($Y=f\times\theta$). In other words, the f$\theta$ lens is a lens that is designed so that the scanning speed of the scanned light is typically constant and does not depend on the position at which the light enters the lens.

That is, when the rotation speeds of the first and second galvano-mirrors 21, 22 are constant, for example, the f$\theta$ lens that serves as the objective lens 42 makes it possible to achieve a constant scanning line speed within the working region that is scanned by the first and second galvano-mirrors 21, 22, where the objective lens 42 forms the image. This prevents differences from occurring between the designed shape and the actual shape of the hardened layer due to variations in the scanning line speed. For example, in a case where the light beam scans to form an image along a desired straight line that is inclined in relation to the X and Y directions, if one or both of the X direction component and the Y direction component of the scanning line speed varies, the scanning light beam cannot plot the intended straight line. The objective lens 42 and the first and second galvano-mirrors 21, 22 described above can alleviate this problem in such a case. The objective lens 42, along with the first and second galvano-mirrors 21, 22, thus makes it possible to achieve a constant scanning line speed over the working region, so that a high-resolution model is formed by precise plotting.

Note that the objective lens 42 that is used in the present invention is not limited to the f$\theta$ lens. The present invention may also be configured such that a lens with an ordinary focusing function is used, the lens's rotation speed is adjusted and controlled electrically by a drive control portion that controls the first and second galvano-mirrors 21, 22, and the lens focuses the light beam that is polarized by the first and second galvano-mirrors 21, 22 and causes it to scan at a constant line scanning speed.

Figure 4:
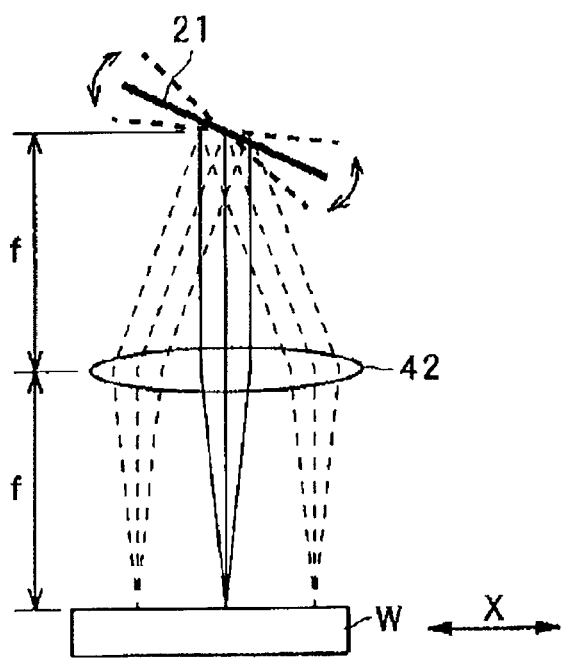
FIG. 4 is a schematic diagram that shows a case where an fθ lens is used as the objective lens and is a figure that is used to explain a function of the objective lens, which is a component of the optical modeling apparatus according to the embodiment of the present invention.

An operation by which the light beam that is emitted by the first light source 11 is made to scan by the first and second galvano-mirrors 21, 22 and the objective lens 42 will be explained using FIG. 4. Note that in FIG. 4, the second galvano-mirror 22, the first and second relay lenses 23, 24, and the beam splitter 41 are omitted in order to show the operation of the first galvano-mirror 21 and the objective lens 42. Note also that the operation of the second galvano-mirror 22 and the objective lens 42 is the same, so a detailed explanation is omitted.

The light beam that is made parallel by the collimator lens 13 and made uniform by the beam expander 15 strikes the first galvano-mirror 21, which causes the light beam to scan in the X direction in accordance with the angle of the first galvano-mirror 21. The light beam is then focused on the working region by the objective lens 42.

When the light beam that is scanned in the X direction by the first galvano-mirror 21 enters the objective lens 42 in a specified state, the objective lens 42 scans the working region in the X direction, causing the light beam to strike in the vertical direction the ultraviolet-curable resin 2 in the working region and forming an image telecentrically. In the same manner, when the light beam that is scanned in the Y direction by the second galvano-mirror 22 enters the objective lens 42 in a specified state, the objective lens 42 scans the working region in the Y direction, causing the light beam to strike in the vertical direction the ultraviolet-curable resin 2 in the working region and forming an image telecentrically.

Incidentally, there is a fixed relationship between the scanning angles of the scanning directions of the first and second galvano-mirrors 21, 22 and the focal length of the objective lens 42. In a case where the fθ lens is used for the objective lens 42, as described above, if the dimensions of the working region in the x direction and the Y direction are each 1 centimeter, that is, if the working region is approximately 1 centimeter by 1 centimeter, and if the scanning angles of the first and second galvano-mirrors 21, 22 are approximately ±10 degrees, then the focal length is approximately 28.65 millimeters. Note that the size of the working region can be varied by varying the scanning angles of the first and second galvano-mirrors 21, 22 and the configuration of the objective lens 42.

Thus the size of the working region is determined by the rotation speeds of the first and second galvano-mirrors 21, 22, the diameter and configuration of the objective lens 42, the structure and placement of other optical parts, and the like. The size of the working region is also determined by the spatial light modulator 32 and the like of the blanket exposure optical system 30, which is described later. The working region is the region in which the hardened layer can be formed when the positional relationship between the optical system 5 and the moving platform 4 does not change within the plane that is parallel to the liquid surface, that is, within the horizontal plane. In the vertical direction Z, the working region is also the region on the moving platform 4 or on an already formed hardened layer. In other words, the working region is the region in which the next hardened layer will be formed.

The objective lens 42 is disposed such that its object focal position, which is its front focal position, is congruent with a reflection/transmission surface 41*a* of the beam splitter 41, and its image focal position, which is its rear focal position, is congruent with the ultraviolet-curable resin 2 in the working region on the moving platform 4. In this case, the ultraviolet-curable resin 2 means the ultraviolet-curable resin 2 that is within the plane on the moving platform 4 that can be scanned by the light beam and that is in the vertical position where the hardened layer is to be formed. In most cases, this means the surface, that is, a position close to the liquid surface. Note that in the above explanation the objective lens 42 is configured such that the object focal position is congruent with the reflection/transmission surface 41*a*. However, the congruence does not have to be exact. It is sufficient for the objective lens 42 to be disposed such that the object focal position is positioned in the vicinity of the reflection/transmission surface 41*a* without making the beam splitter 41 itself too large. In other words, because it is necessary for all of the light beam from the beam scanning optical system 10 and all of the light from the blanket exposure optical system 30 to pass through the reflection/transmission surface 41*a*, it is sufficient for the object focal position of the objective lens 42 to be positioned in the vicinity of the reflection/transmission surface 41*a* without making the beam splitter 41 itself too large.

Each of the first and second relay lenses 23, 24 can cause the parallel incident light beam to exit as a parallel light beam across the scanning angle that is required by the first and second galvano-mirrors 21, 22, respectively. Each of the first and second relay lenses 23, 24 can also form the light beam that is respectively reflected by the first and second galvano-mirrors 21, 22 as object surfaces into an image on the second galvano-mirror 22 and the reflection/transmission surface 41*a* of the beam splitter 41, which are respectively on the downstream sides the first and second relay lenses 23, 24.

That is, the first relay lens 23 is a lens cluster that has at least one lens and forms the light beam that is reflected by the first galvano-mirror 21 into an image on the reflective surface of the second galvano-mirror 22. The second relay lens 24 is a lens cluster that has at least one lens and forms the light beam that is reflected by the second galvano-mirror 22 into an image on the reflection/transmission surface 41*a* of the beam splitter 41.

Figure 5:
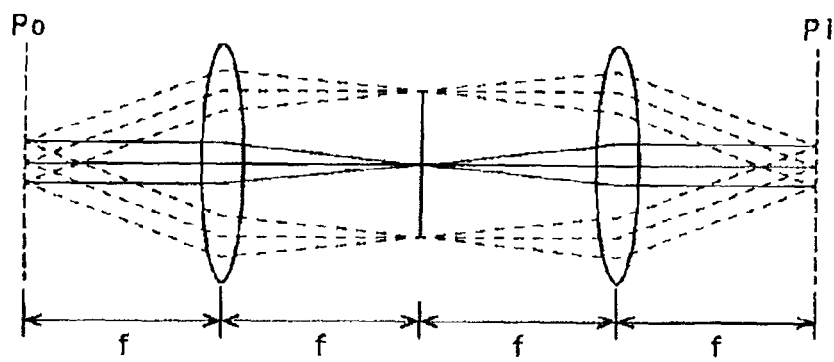
FIG. 5 is a schematic diagram that shows an example of a bilateral telecentric image optical system and is a figure that is used to explain a function of first and second relay lenses that are components of the optical modeling apparatus according to the embodiment of the present invention.

Each of the first and second relay lenses 23, 24 that have these functions are configured to be a bilateral telecentric image optical system. Note that FIG. 5 shows an optical system called a 4f optical system, which is a typical example of an optical system that functions as a bilateral telecentric image optical system. In the telecentric image optical system shown in FIG. 5, an object surface Po that corresponds to one of the first and second galvano-mirrors 21, 22 is disposed at the front focal position of the lens that is disposed in the frontmost position. An image surface Pi that corresponds to one of the second galvano-mirror 22 and the beam splitter 41 is disposed at the rear focal position of the lens that is disposed in the rearmost position. This arrangement means that when a light beam that is focused on any position on the object surface Po diverges and enters the telecentric image optical system, the light beam converges on the corresponding position on the image surface Pi. Moreover, a light beam that enters as a parallel beam from any position on the object surface Po will strike the corresponding position on the image surface Pi as a parallel beam. Thus, a parallel beam from the object surface that enters the bilateral telecentric image optical system at a specified position in a specified direction exits the bilateral telecentric image optical system as a parallel beam that strikes the image surface at the corresponding position and in the corresponding direction.

The second relay lens 24 guides the light beam that is polarized by the second galvano-mirror 22 such that the light beam passes through the object focal position of the objective lens 42, that is, the center of the reflection/transmission surface 41*a*. The second relay lens 24 also causes the light beam to pass through the object focal position at a specified angle, such that the light beam enters the objective lens 42 at a specified position. That is, the second relay lens 24 guides the light beam that is polarized by the second galvano-mirror 22 such that the light beam passes through the front focal position of the objective lens 42 and strikes the objective lens 42 at an angle that corresponds to the position at which the optical axis of the light beam is scanned within the working region.

The first relay lens 23 guides the light beam that is polarized by the first galvano-mirror 21 such that the light beam passes through the object focal position of the objective lens 42, that is, the center of the reflection/transmission surface 41a, by way of the second galvano-mirror 22 and the second relay lens 24. The first relay lens 23 also causes the light beam to pass through the object focal position at a specified angle, such that the light beam enters the objective lens 42 at a specified position. That is, the first relay lens 23 guides the light beam that is polarized by the first galvano-mirror 21 such that the light beam passes through the front focal position of the objective lens 42 and strikes the objective lens 42 at an angle that corresponds to the position at which the optical axis of the light beam is scanned within the working region.

In other words, the first and second relay lenses 23, 24 cause the light beam that the first and second galvano-mirrors 21, 22, which are arranged in different positions, polarize and scan in the X direction and the Y direction, respectively, to pass once through the front focal position of the objective lens 42.

The light beam is polarized and scanned in the X direction and the Y direction, respectively, by the first and second galvano-mirrors 21, 22, which are arranged in different positions. The first and second relay lenses 23, 24 cause the light beam to pass once through the front focal position of the objective lens 42, such as the fθ lens or the like, by adjusting the position in the X direction and the Y direction at which the light beam passes through. That is, the first and second relay lenses 23, 24 cause the two-dimensionally modulated light beam to pass through at an angle that corresponds to the position at which the object focal point of the fθ lens is scanned, using the fθ lens to project the light beam. It is therefore possible to make the light beam that is focused by the objective lens 42 orthogonal to the liquid surface of the ultraviolet-curable resin 2, regardless of the scanned position. This makes high-resolution modeling possible, because it prevents an inclined surface from being formed in each hardened layer due to the light beam's being focused obliquely. Furthermore, because the first and second relay lenses 23, 24 thus cause the modulated light beam to strike the liquid surface of the ultraviolet-curable resin 2 orthogonally, it is possible to make the light path of the returning reflected light beam congruent with the light path of the outgoing light beam and to guide the reflected light beam to the reflected light detector 18, which is described later.

The beam splitter 41 is disposed where it is because the light path of the light beam is combined with the path of the light from the blanket exposure optical system 30, which is described later. The objective lens 42 is disposed between the beam splitter 41 and the ultraviolet-curable resin 2 for the same reason. The first and second galvano-mirrors 21, 22 are also disposed between the beam splitter 41 and the first light source 11. The first and second relay lenses 23, 24 prevent the first and second galvano-mirrors 21, 22 and the beam splitter 41 from physically colliding with one another due to the rotation of the reflective portions of the galvano-mirrors. That is, the first and second relay lenses 23, 24 interpose distances between the first and second galvano-mirrors 21, 22 and the beam splitter 41 that are greater than the range within which the first and second galvano-mirrors 21, 22 and the beam splitter 41 can collide.

Note that in the present embodiment, the beam splitter 41 is disposed for the purpose of bringing into congruence the light paths of the light that is emitted by the beam scanning optical system 10 and the light that is emitted by the blanket exposure optical system 30, which is described later. In other words, by combining the light paths such that the light beam and the light that are emitted by the two optical systems are both orthogonal to the working region, the beam splitter 41 makes high-resolution modeling possible, because it prevents an inclined surface from being formed in each hardened layer due to irradiation from an inclined direction that is tilted away from the orthogonal direction.

The reason why the objective lens 42 is disposed between the beam splitter 41 and the ultraviolet-curable resin 2 is that if the objective lens 42 were disposed before the beam splitter 41, the beam splitter 41 would have to be much larger. Disposing the objective lens 42 between the beam splitter 41 and the ultraviolet-curable resin 2 also makes it possible to prevent the occurrence of problems such as an error in the irradiation position of the scanned light beam, for example, due to the great distance between the objective lens and the ultraviolet-curable resin 2.

The beam scanning optical system 10 is configured as described above from the collimator lens 13, the anamorphic lens 14, the beam expander 15, and the scanning device 12, which includes the first light source 11, the first and second galvano-mirrors 21, 22, the first and second relay lenses 23, 24, and the objective lens 42. In the beam scanning optical system 10 of the optical modeling apparatus 1, the collimator lens 13 converts the light beam emitted by the first light source 11 into a roughly parallel light beam, the anamorphic lens 14 shapes the beam, and the beam expander 15 adjusts the beam diameter. The first and second galvano-mirrors 21, 22 polarize the light beam such that it scans in the X direction and the Y direction. The first and second relay lenses 23, 24 cause the light beam to pass through the front focal position of the objective lens 42, and the beam splitter 41 guides the light beam to the objective lens 42. Then the objective lens 42 focuses the light beam on and scans it over a desired position on the ultraviolet-curable resin 2, irradiating and plotting a precise region to form the hardened layer.

In most of the known modeling apparatuses that use the ordinary beam scanning method, the X direction galvano-mirror and the Y direction galvano-mirror are disposed close to one another, and two-dimensional scanning is performed. However, because the optical modeling apparatus 1 described above combines the beam scanning optical system 10 and the blanket exposure optical system 30, described later, the optical modeling apparatus 1 is configured such that the first relay lens 23 causes the light beam that is polarized in the X direction by the first galvano-mirror 21 to form an image on the second galvano-mirror 22, and the second relay lens 24 causes the light beam that is polarized in the Y direction by the second galvano-mirror 22 to form an image on the object focal point of the objective lens 42.

In other words, because the beam splitter 41 is provided between the working position and the first and second galvano-mirrors 21, 22 in order to combine the beam scanning optical system 10 and the blanket exposure optical system 30, described later, the objective lens 42 is provided between the beam splitter 41 and the working position. The first and second relay lenses 23, 24 telecentrically form the light beam into high-precision images on the first and second galvano-mirrors 21, 22 and on the specified position in the working region, even in a case where the distance between the working position and the first and second galvano-mirrors 21, 22 is great. Here, the working position is a position that is provided in the working region, that is, in the ultraviolet-curable resin 2 on the moving platform 4.

The optical modeling apparatus 1 is thus capable of using the beam scanning optical system 10, which includes the scanning device 12 and the like described above, to perform the desired precise plotting on the ultraviolet-curable resin 2. The optical modeling apparatus 1 can thus produce the hardened layer of the desired shape with greater precision and achieve high-resolution modeling.

Figure 6A:
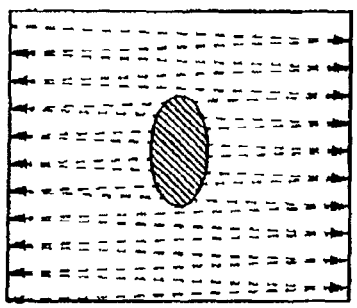
FIG. 6A is a plan view that shows a raster scanning method in a beam scan optical system or the like of the optical modeling apparatus according to the embodiment of the present invention.
Figure 6B:
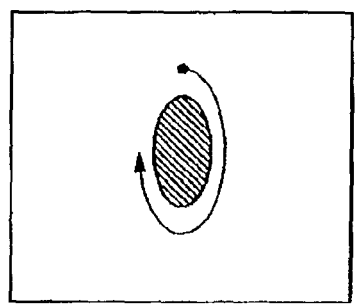
FIG. 6B is a plan view that shows a vector scanning method in a beam scan optical system or the like of the optical modeling apparatus according to the embodiment of the present invention.
Figure 6C:
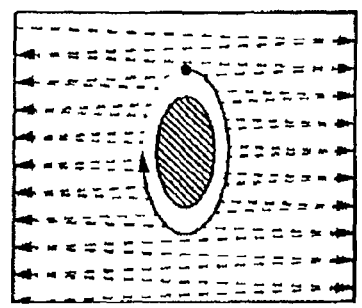
FIG. 6C is a plan view that shows a combined raster-vector scanning method in a beam scan optical system or the like of the optical modeling apparatus according to the embodiment of the present invention.

Note that the beam scanning optical system 10, in accordance with the cross section shape data, is capable of switching as necessary between raster scanning and vector scanning, and can also perform combined raster-vector scanning, as shown in FIG. 6C. Raster scanning, as shown in FIG. 6A, plots the cross section shape by reciprocating linear scanning in one direction at a time. Vector scanning, as shown in FIG. 6B, scans boundary portions (edge portions) and the like smoothly in a curved line.

The light beam that scans and irradiates the ultraviolet-curable resin 2 as described above is reflected by one of the ultraviolet-curable resin 2 and the hardened layer. The beam scanning optical system 10 of the optical modeling apparatus 1 includes the reflected light detector 18, which detects the reflected light beam (hereinafter called the "reflected light"). The reflected light detector 18 detects the reflected light that is reflected by the ultraviolet-curable resin 2, passed through the various optical system parts, and is reflected by the beam splitter 16. The optical modeling apparatus 1 can use the detection of the reflected light by the reflected light detector 18 to perform focus correction.

The method that the reflected light detector 18 uses to detect the signal for focus correction may be, for example, any one of the astigmatism method, the triangulation method, or the like. Note that in a case where the astigmatism method is used, an element that imparts astigmatism, such as a cylindrical lens or the like, is provided, and the signal for focus correction is detected by detecting the astigmatism that the element creates. In a case where the triangulation method is used, the returning (return path) light beam is formed such that it is at a slight angle in relation to the outgoing light beam, and the signal for focus correction is detected by detecting the distance from the outgoing path light beam to the returning light beam.

Note that the focus detection and correction by the reflected light detector 18 may be performed constantly. It may also be configured such that it is performed at least when each hardened layer is formed, that is, every time the moving platform 4 moves in the vertical direction Z. A configuration may also be adopted in which, during a step-and-repeat operation that is described later, it is performed for each specified individual working region, that is, every time the moving platform 4 moves, in the horizontal X and/or Y directions and/or in the vertical direction Z.

The optical modeling apparatus 1 can also use the reflected light detector 18 described above to detect whether the position on the ultraviolet-curable resin 2 where the light beam is scanning is a hardened portion or an unhardened portion. That is, the reflected light detector 18 utilizes a property of the ultraviolet-curable resin 2, that its reflectivity changes when it hardens, and functions as a reflected light monitor that monitors the intensity of the reflected light.

Based on the reflected light detector 18 as a reflected light monitor, the optical modeling apparatus 1 detects the state of the formed hardened layer, thus forming the hardened layer with greater precision and producing the three-dimensional model with higher resolution. For example, the reflected light detector 18 detects the reflected light even when optical and/or electrical distortion occurs while the beam scanning optical system 10 is performing the plotting. The optical modeling apparatus 1 utilizes the electrical structure of the distortion to form the hardened layer with high precision and to produce the three-dimensional model with high resolution.

Note that a case has been explained in which the two functions of focus detection and reflected light monitoring are performed at the same time by the reflected light beam splitter 16 and the reflected light detector 18, but a configuration may also be used in which two beam splitters and two reflected light detectors are provided.

To configure the blanket exposure optical system 30, the optical modeling apparatus 1 is provided with the second light source 31, the spatial light modulator 32, a polarizing plate 33, a beam integrator 34, a reflector 35, and a condenser lens 36. The polarizing plate 33 converts the light that is emitted by the second light source 31 into a specified polarized light. The beam integrator 34 makes the light that passes through the system uniform. The reflector 35 guides the light from the beam integrator 34 to the spatial light modulator 32. The condenser lens 36 focuses the light that is spatially modulated by the spatial light modulator 32 on the front focal point of the objective lens 42.

In the present embodiment, a shutter 37 is provided between the second light source 31 and the polarizing plate 33 to control whether the light beam that irradiates the ultraviolet-curable resin 2 passes through or is blocked, that is, to control the on-off status of the exposure by the blanket exposure optical system 30.

The second light source 31, which serves as a blanket exposure light source that is used by the blanket exposure optical system 30, may be, for example, an array that uses high-output blue light emitting diodes (LEDs). Note that it is not necessary for the blanket exposure light source to use a coherent laser light source such as the beam scanning light source uses. The light emitted by the LED array that is the second light source 31 is made uniform by the beam integrator 34.

An ordinary beam integrator can be used as the beam integrator 34. Possible types include a fly-eye type, in which a plurality of lens elements are formed into an array, and a light rod type, which is structured from columnar rod lenses, such as square prisms or the like, such that it reflects all internal light. The light that passes through the beam integrator 34 uniformly irradiates a transmissive liquid crystal element 38 that is described below.

The transmissive liquid crystal element 38 that is used as the spatial light modulator 32 of the optical modeling apparatus 1 may, for example, have a transparent electrode and a liquid crystal layer that is made up of a liquid crystal enclosed between two overlapping transparent substrates. Based on a drive signal for each individual pixel, the transmissive liquid crystal element 38 spatially modulates the light that passes through it by changing the arrangement of the liquid crystal molecules to correspond to the image it projects, thus changing the transmissive polarization direction. The transmissive liquid crystal element 38 then projects the desired projected light onto the ultraviolet-curable resin 2. Here, the projected image means the light that is projected such that it corresponds to the shape for which the blanket exposure will be made. Note that the present embodiment has been explained using the transmissive liquid crystal element 38 as the spatial light modulator 32, but the present invention is not limited by this explanation. The spatial light modulator 32 may be configured using a digital mirror micro-device, in which a plurality of reflective micro-mirrors are arrayed whose angles of inclination vary according to an input signal, a reflective liquid crystal element (liquid crystal on silicon), or the like. Where the digital mirror micro-device is used, each micro-mirror corresponds to one pixel, as described later.

In the present embodiment, the number of pixels in the transmissive liquid crystal element 38 is 1 million, made up of 1000 pixels in each of the vertical and horizontal directions. The size of the space on the working region that corresponds to one pixel of light that passes through the condenser lens 36 and the objective lens 42 is approximately 10 µm by 10 µm. This means that the blanket exposure optical system 30 that has the transmissive liquid crystal element 38 can perform a blanket exposure of a specified region for which it needs to do the blanket exposure within a 1 cm×1 cm region by doing a blanket exposure of each fixed (10 µm×10 µm) region that corresponds to each individual pixel. Thus the 1 cm×1 cm region for which the transmissive liquid crystal element 38 that serves as the spatial light modulator 32 can perform the blanket exposure is the working region. Note that increasing the number of pixels makes it possible to reduce the size of the fixed region that corresponds to one pixel, thus increasing the precision of the blanket exposure. It is also possible to change the size of the working region by changing the configuration of the condenser lens 36 and the objective lens 42. Furthermore, the transmissive liquid crystal element 38 may also be configured such that it changes the number of pixels it uses and changes the projected size for each layer or for each segmented region, described later, according to the shape data for the shape it is to form.

In the above description, the optical modeling apparatus 1 is configured to use the transmissive liquid crystal element 38 as the spatial light modulator 32 and to use the polarizing plate 33 to cause the specified polarized light to strike the transmissive liquid crystal element 38. However, the optical modeling apparatus 1 may also be configured to use another method of causing the specified polarized light to enter the transmissive liquid crystal element 38.

The condenser lens 36 is provided between the spatial light modulator 32 and the objective lens 42, and together with the objective lens 42, it functions as a projection optical system that forms the light that is spatially modulated by the spatial light modulator 32 into an image on the ultraviolet-curable resin 2. The condenser lens 36 is configured from a lens cluster that corrects distortion when the light that is spatially modulated by the spatial light modulator 32 passes through the objective lens 42. Thus the condenser lens 36 not only functions as the projection optical system, but also can reduce the distortion to the greatest possible extent. In other words, the condenser lens 36 can prevent distortion from occurring when the light from the blanket exposure optical system 30 passes through the objective lens 42 of the beam scanning optical system 10, which happens because the beam scanning optical system 10 is combined with the blanket exposure optical system 30, as described later.

As described above, the blanket exposure optical system 30 is configured from the second light source 31, the spatial light modulator 32, such as the transmissive liquid crystal element 38 or the like, the polarizing plate 33, the beam integrator 34, the reflector 35, the condenser lens 36, and the objective lens 42. In the blanket exposure optical system 30 of the optical modeling apparatus 1, the light beam that is emitted by the second light source 31 is converted into a specified polarized light by the polarizing plate 33. The beam integrator 34 makes the light beam uniform. The transmissive liquid crystal element 38 that is the spatial light modulator 32 spatially modulates the light such that the light is projected to perform the specified exposure. The condenser lens 36 focuses the light that is spatially modulated by the spatial light modulator 32 on the front focal point of the objective lens 42. The condenser lens 36 focuses the light on the front focal position of the objective lens 42. The light passes through the objective lens 42 to irradiate and perform the desired exposure of the ultraviolet-curable resin 2.

In the course of this process, in the blanket exposure optical system 30, the light that is spatially modulated by the spatial light modulator 32 is focused by the condenser lens 36 on the beam splitter 41, that is, on the front focal position of the objective lens 42. The light is combined there with the light beam that is scanned through the beam scanning optical system 10, and the combined light passes through the objective lens 42 to irradiate and form the image on the ultraviolet-curable resin 2. At this time, the condenser lens 36 reduces the distortion to the greatest possible extent.

Further, the spatial light modulator 32 can increase the intensity of the light that is emitted by using the LED array as the second light source 31. Therefore, in the range over which the light that is spatially modulated by the spatial light modulator 32 is formed into an image by the condenser lens 36 and the objective lens 42, the hardened layer can be formed in a specified time that is matched to the light intensity, making high-speed modeling possible.

As described above, to produce the desired model, the optical modeling apparatus 1 can use the blanket exposure optical system 30 that is configured from the spatial light modulator 32 and the like to perform general plotting (that is, rough plotting) over a specified range on the ultraviolet-curable resin 2 in a region that is included in the desired shape of each layer. The general plotting is done in one fixed region at a time, with each fixed region corresponding to one pixel. Thus a hardened layer in a fixed range can be formed by a single exposure, that is, in a short time. The blanket plotting thus achieves high-speed modeling.

The optical modeling apparatus 1 uses the beam splitter 41 to combine the light paths of the light beam that is scanned by the beam scanning optical system 10 and the light that is spatially modulated by the spatial light modulator 32 of the blanket exposure optical system 30. High-speed, high-resolution modeling is achieved by irradiating the ultraviolet-curable resin 2 on the moving platform 4 through the objective lens 42.

That is, the optical modeling apparatus 1 described above is capable of emitting, both simultaneously and individually, the light beam that is scanned by the scanning device 12 and the light that is spatially modulated by the spatial light modulator 32, making higher-speed modeling possible.

In this process, the light beam from the beam scanning optical system 10 and the light from the blanket exposure optical system 30 are combined by the beam splitter 41, so even in a case where only one of the optical systems is used, it is possible for the one of the light beam and the light that is used to irradiate the ultraviolet-curable resin 2 orthogonally. This makes high-resolution modeling possible without inclining the hardened layers and the model in an inclined direction in relation to the horizontal direction.

Furthermore, the optical modeling apparatus 1 makes it possible to do both high-speed modeling and high-resolution, precision modeling, according to the shape of each layer of the target three-dimensional model. For the portions where a large portion can be blanket-exposed, the optical modeling apparatus 1 does high-speed modeling by using the blanket exposure optical system 30 to emit the light that is spatially modulated by the spatial light modulator 32. For the portions that require high-resolution modeling, such as the boundary portions and the like, the optical modeling apparatus 1 uses the scanning device 12 to emit the scanned light beam.

Figure 7:
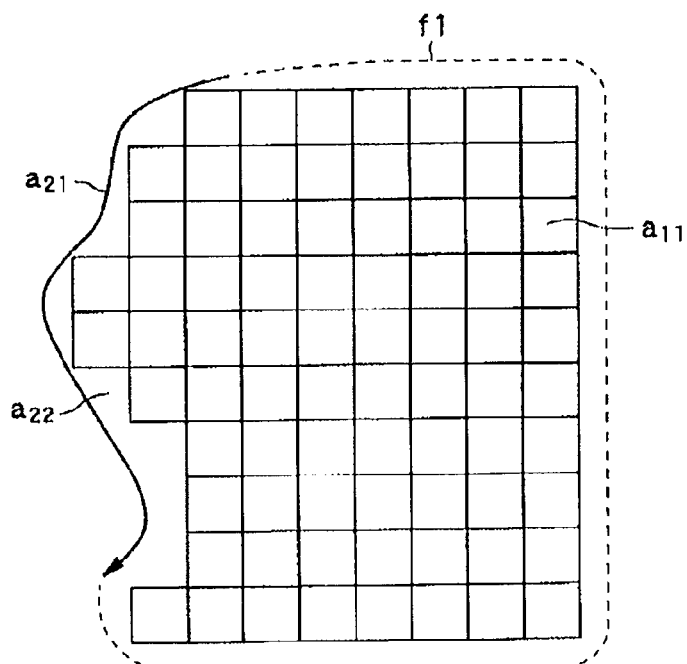
FIG. 7 is a plan view that shows a target two-dimensional shape that is the shape of a single hardened layer, a blanket-plotted portion, and a precision-plotted portion and is a figure that is used to explain blanket plotting and precision plotting when a single hardened layer of a three-dimensional model that serves as a target is formed by the optical modeling apparatus according to the embodiment of the present invention.

For example, in a case where a target two-dimensional shape f1 that is the shape of each layer of the target three-dimensional model lies within the working region, as shown in FIG. 7, the optical modeling apparatus 1 operates as described below. The optical modeling apparatus 1 uses the light that is spatially modulated by the spatial light modulator 32 to do the blanket exposure (blanket plotting), thus performing rough plotting (hereinafter also called "blanket plotting") of a portion (hereinafter also called the "blanket-plotted region") that combines the individual fixed regions that correspond to the individual pixels, as described above. The blanket-plotted region is the portion in the interior of the desired shape of each layer that makes up the model of the desired shape. The blanket plotting forms a large portion $a_1$ (hereinafter also called the "blanket-plotted portion") of the hardened layer of the ultraviolet-curable resin 2 that contains at least one hardened portion all that corresponds to a single pixel. The optical modeling apparatus 1 also uses the light beam that is scanned by the scanning device 12 to perform precision plotting of a boundary portion $a_{21}$ that is the desired shape of each layer and an interval portion $a_{22}$ between the boundary portion and the roughly plotted portion. (Hereinafter, the combination of the boundary portion and the interval portion is also called the "precision-plotted region".) The precision plotting forms a precision portion $a_2$ (hereinafter also called the "precision-plotted portion") of the hardened layer of the ultraviolet-curable resin 2.

Figure 8:
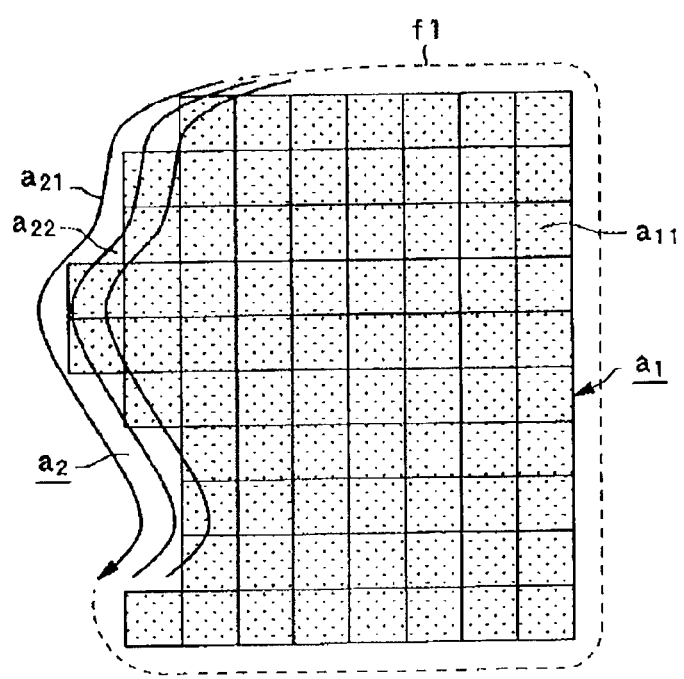
FIG. 8 is a plan view that shows the blanket plotting that is done by the blanket exposure and the precision plotting that is done by beam scanning with the vector scanning method and is a figure that is used to explain the blanket plotting and the precision plotting when a single hardened layer of a three-dimensional model that serves as a target is formed by the optical modeling apparatus according to the embodiment of the present invention.
Figure 9:
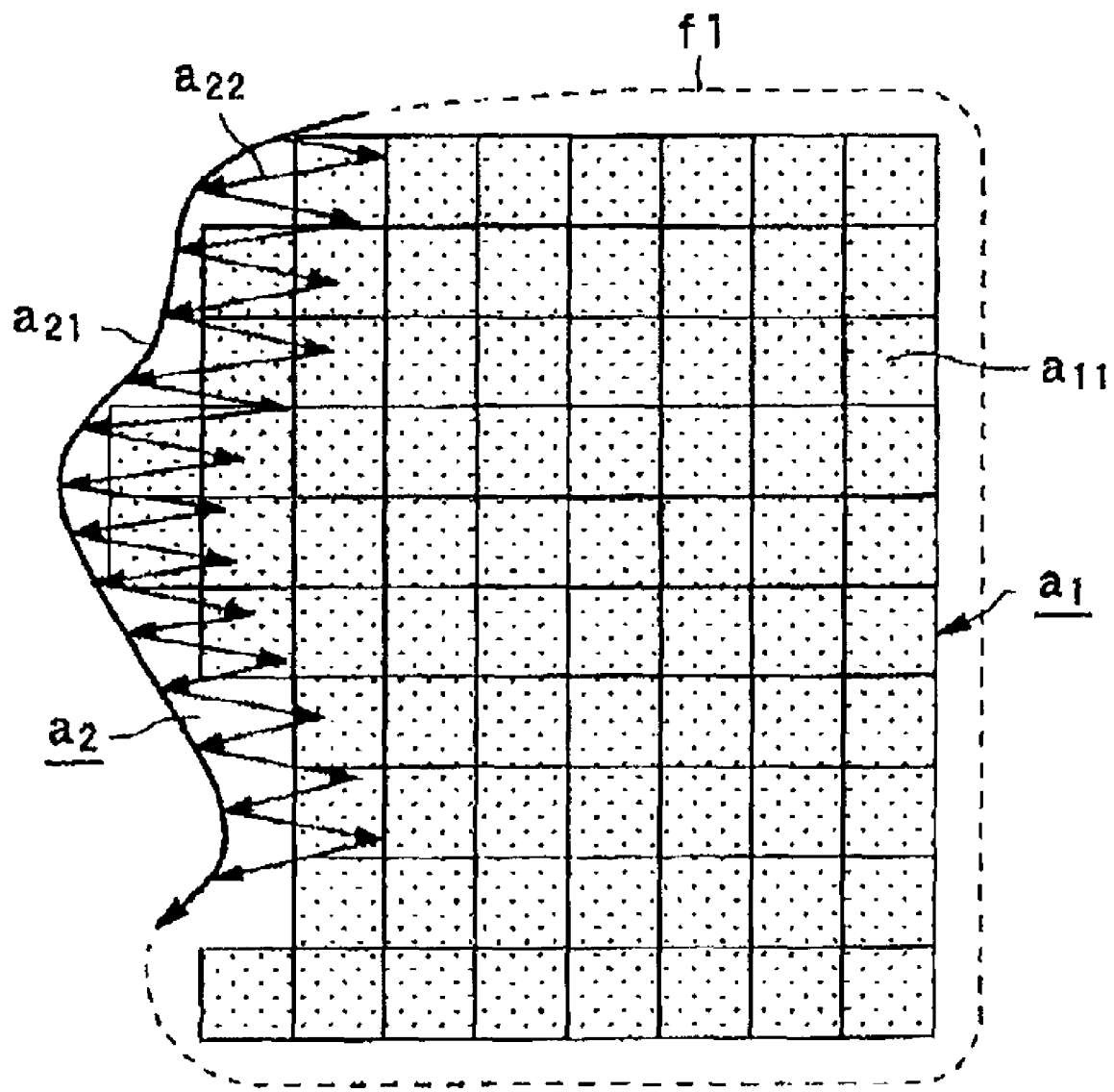
FIG. 9 is a plan view that shows the blanket plotting that is done by the blanket exposure and the precision plotting that is done by beam scanning with the combined raster-vector scanning method and is a figure that is used to explain the blanket plotting and the precision plotting when a single hardened layer of a three-dimensional model that serves as a target is formed by the optical modeling apparatus according to the embodiment of the present invention.

Note that during the precision plotting, the precision portion $a_2$ of the hardened layer may be formed by using the beam scanning optical system 10 that is configured from the scanning device and the like to perform repeated vector scanning of the boundary portion $a_{21}$ and the interval portion $a_{22}$, as shown in FIG. 8. The precision portion $a_2$ of the hardened layer may also be formed by performing vector scanning of the boundary portion $a_{21}$ and raster scanning of the interval portion $a_{22}$, as shown in FIG. 9.

Thus the optical modeling apparatus 1 can form the hardened layer of the target two-dimensional shape shown in FIG. 7 in a shorter time than it can be formed by the known beam scanning optical modeling apparatus. The optical modeling apparatus 1 can also form the hardened layer with greater precision than it can be formed by the known blanket exposure optical modeling apparatus. The optical modeling apparatus 1 can also move the working region to the position for forming the next hardened layer by moving the moving platform downward in the vertical direction Z, as described above. That is, the optical modeling apparatus 1 can form the three-dimensional model by repeating the operation of changing the formed layer. By forming the high-precision hardened layer in a short time, as described above, the optical modeling apparatus 1 makes it possible to form the high-precision model in a short time.

As shown in FIG. 1, the optical modeling apparatus 1 according to the embodiment of the present invention is provided with the moving section 6, which moves one of the moving platform 4 and the optical system 5, which is configured from the scanning device 12, the spatial light modulator 32, the beam splitter 41, and the like described above, in the X direction and the Y direction in a horizontal plane parallel to the liquid surface of the ultraviolet-curable resin 2. Note that in the present embodiment, the moving section 6 is a moving section that drives the moving platform 4 in the two roughly orthogonal axial directions X and Y within the horizontal plane parallel to the liquid surface of the ultraviolet-curable resin 2, but the present invention is not limited to this structure, and the moving section 6 may be anything that changes the relative positions of the moving platform 4 and the optical system 5 by moving at least one of them. Furthermore, a case is explained here in which the moving platform 4 is moved within the plane parallel to the liquid surface in relation to the reservoir 3 as well, but the movement within the plane may also be a simultaneous movement of the moving platform 4 and the reservoir 3.

The moving section 6 can change the relative positions of the moving platform 4 and the optical system 5 in the horizontal plane by, for example, moving the moving platform 4 in the x direction and/or the Y direction. The moving section 6 thus can change the region where the optical system 5 can form the hardened layer on the moving platform 4 and on the hardened layers that are accumulated on the moving platform 4. That is, the moving section 6 can change the working region.

Thus the optical modeling apparatus 1, by being driven and controlled by the data processing and control portion 101 that is described later, can use the moving platform 4 and the moving section 6 to change the relative positional relationship between the optical system 5 and the moving platform 4 in the X, Y, and Z directions. Note that a case is explained here in which the relative positional relationship can be changed in the X, Y, and Z directions, but the position of the moving platform 4 can also be changed in the Z direction axial rotation direction, for example. This makes it possible to form the model at even higher speed and with higher resolution.

The optical modeling apparatus 1 can also perform an operation (hereinafter called the "step-and-repeat operation") that sequentially repeats the operation in which the moving section 6 changes the relative positions of the moving platform 4 and the optical system 5 and the operation in which the hardened layer is formed by the light and the light beam emitted by the optical system 5. The step-and-repeat operation allows the optical modeling apparatus 1 to perform modeling across a wider range, thus making it possible to form larger models with high resolution.

The step-and-repeat operation will be explained in detail. Note that in the explanation that follows, the model will be created by the optical modeling apparatus 1 with the dimensions of the plane parallel to the liquid surface of the ultraviolet-curable resin 2 set to 10 cm×10 cm or less, for example. Furthermore, the dimension in the height direction that is orthogonal to the liquid surface of the model is determined by the range of movement in the Z direction of the moving platform 4.

Figure 10:
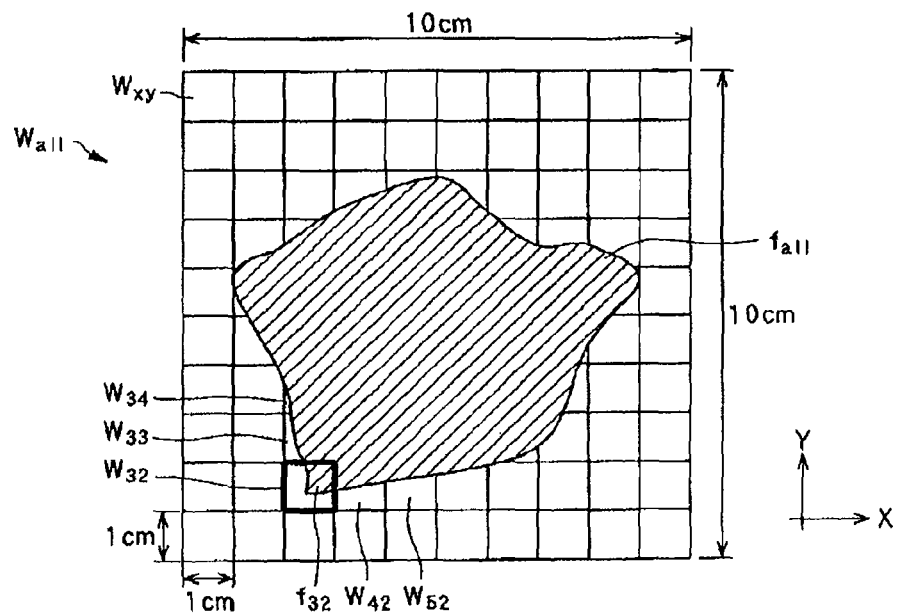
FIG. 10 is a plan view that is used to explain a dividing of an entire working region into specified individual working regions and is a figure that is used to explain a step-and-repeat operation by the optical modeling apparatus according to the embodiment of the present invention.

The optical modeling apparatus 1 that is capable of performing the step-and-repeat operation forms the hardened layers on the moving platform 4 as shown in FIG. 10, for example. The 10 cm×10 cm region is defined as the total working region $W_{a11}$ and indicates the maximum region in which each layer of the model can be formed. The total working region $W_{a11}$ is divided into individual working regions $W_{xy}$, which are individual segmented regions measuring 1 cm×1 cm, for example. The optical modeling apparatus 1 emits the light and the light beam from the optical system 5 for each of the working regions $W_{xy}$. Then the optical modeling apparatus 1 forms each hardened layer of the desired model in sequence by using the moving section 6 to change the relative positions of the moving platform 4 and the optical system 5.

Figure 11:
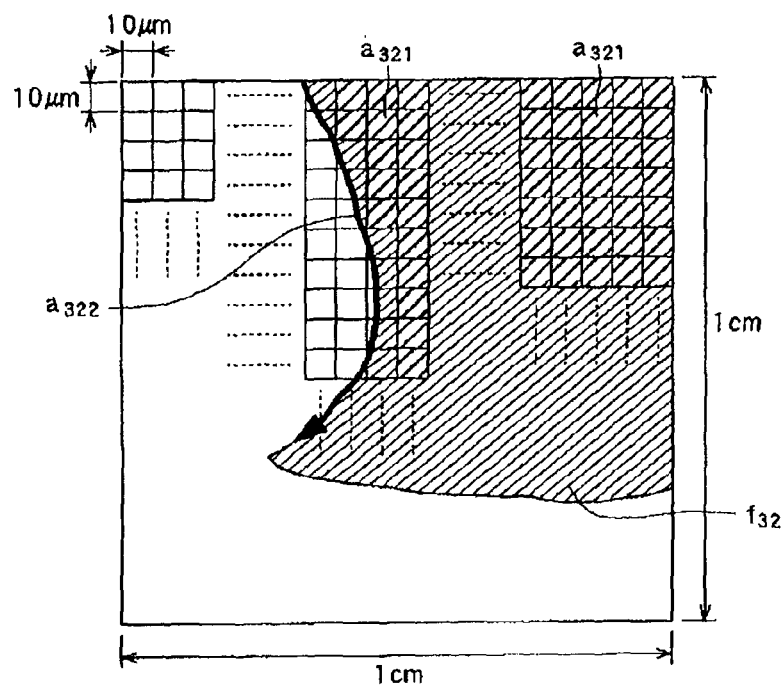
FIG. 11 is a plan view that shows a working region W32 that is one of the individual working regions into which the entire working region shown in FIG. 10 is divided.

Specifically, in a case where a two-dimensional shape, shown as fa1l in FIG. 10, lies within the total working region $W_{a11}$, the optical system 5 is first positioned to face a working region $W_{32}$ on the moving platform 4, shown in FIGS. 10 and 11, and uses the light that is spatially modulated by the spatial light modulator 32 of the blanket exposure optical system 30 to perform rough plotting in the working region $W_{32}$. This forms blanket-plotted portions $a_{321}$ that cover a large portion of the hardened layer within the working region $W_{32}$. Further, the light beam that is scanned by the scanning device 12 of the beam scanning optical system 10 is used to perform precision plotting to form a precision-plotted portion $a_{322}$ that is a precision portion of the hardened layer within the working region $W_{32}$. A specified shape $f_{32}$ can thus be formed within the working region $W_{32}$.

The relative positions of the moving platform 4 and the optical system 5 are then changed by the moving section 6 such that the optical system 5 is positioned to face another of the working regions $W_{xy}$ on the moving platform 4. The hardened layer is formed in the working region $W_{xy}$ in the same manner as in the working region $W_{32}$ described above. Each hardened layer of the model can be formed by repeating this step-and-repeat operation. The model can be formed as described above by moving the moving platform 4 in the Z direction, then sequentially repeating the step-and-repeat operation to accumulate the individual hardened layers.

Thus the optical modeling apparatus 1, which has the moving section 6 that changes the relative positions of the moving platform 4 and the optical system 5, and which performs the step-and-repeat operation, can harden, with high resolution and in a short time, a region that covers a comparatively large range. This makes it possible to form a comparatively large three-dimensional model.

Note that within the specified small region described above, measuring approximately 1 cm×1 cm, the blanket exposure optical system 30 performs the rough plotting on the order of approximately 10 μm, and the beam scanning optical system 10 performs the precision plotting on the order of approximately 1 μm. Further, the comparatively large model measuring approximately is created 10 cm×10 cm is created by performing the step-and-repeat operation. However, the modeling of an even larger model can be achieved by using the moving section 6 to move the moving platform 4 and the like over a still wider range, and even more precise plotting can be achieved by changing the number of pixels in the spatial light modulator 32 of the blanket exposure optical system 30 and by changing the configuration of the beam scanning optical system 10 such that it can form a smaller beam spot.

Incidentally, the optical modeling apparatus 1 according to the embodiment of the present invention is also provided with a data processing and control device 100 that has a hard disk that stores a data base, a program, and the like, a random access memory (RAM) into which data is loaded, a central processing unit (CPU) that performs computations, and the like.

Figure 12:
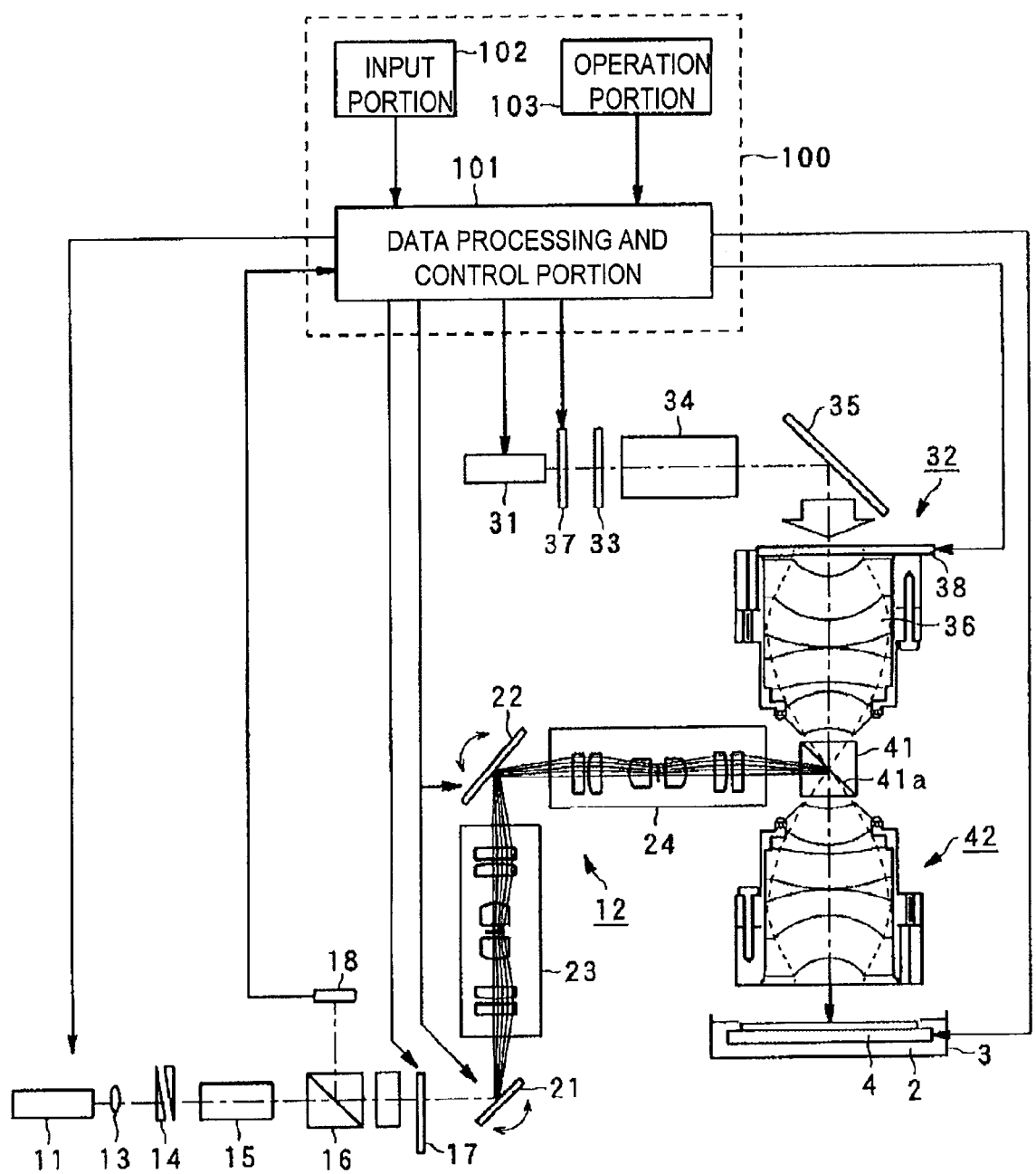
FIG. 12 is a figure that is used to explain a data processing and control device that performs data processing and control of the optical system of the optical modeling apparatus according to the embodiment of the present invention.

The data processing and control device 100, as shown in FIG. 12, includes the data processing and control portion 101, which processes various types of data and controls the various optical parts and the like, an input portion 102 that inputs three-dimensional shape data and the like into the data processing and control portion 101, and an operation portion 103 that operates the data processing and control portion 101.

The data processing and control portion 101, as shown in FIG. 12, performs control of the precision plotting of the beam scanning optical system 10 by performing laser control of the first light source 11, by performing control of the transmission and blocking of the light beam by the shutter 17, and by performing control of the rotational driving of the reflectors of the first and second galvano-mirrors 21, 22.

The data processing and control portion 101 also performs control of the blanket plotting of the blanket exposure optical system 30 by performing control of the light intensity and the like of the second light source 31, and by performing control of the transmission and blocking of the light by the shutter 37.

The data processing and control portion 101 also controls the moving section 6 to move the moving platform 4 in the X and Y directions such that the working region is positioned at a specified position on the moving platform 4 that corresponds to the specified segmented region. When the forming of the segmented region in the specified position is completed, the data processing and control portion 101 moves the moving platform 4 in the X and Y directions such that the working region is positioned at a specified position on the moving platform 4 that corresponds to the next specified segmented region. When the hardening of the hardened layer of the specified height is completed, the data processing and control portion 101 controls the moving platform 4 to move the moving platform 4 downward in the vertical direction Z by a specified amount, changing the position of the working region in the Z direction and changing the layer to be formed.

The data processing and control portion 101 can also detect the focus correction and the state of the hardened layer by receiving feedback such as a focus signal or the like that is detected by the reflected light detector 18, thus achieving even higher-resolution modeling.

The optical modeling apparatus 1 according to the embodiment of the present invention includes the first light source 11, the scanning device 12, the second light source 31, and the spatial light modulator 32. The first light source 11 emits the light beam that plots the shape on the light-curable resin such as the ultraviolet-curable resin 2 or the like. The scanning device 12 causes the light beam that is emitted by the first light source 11 to scan over light-curable resin. The second light source 31 emits the light that irradiates one fixed region at a time on the light-curable resin. The spatial light modulator 32 spatially modulates the light that is emitted by the second light source 31 to perform a blanket exposure of the specified region on the light-curable resin. The optical modeling apparatus 1 forms each hardened layer by hardening the light-curable resin, using the light beam that is scanned by the scanning device 12, and the light that is spatially modulated by the spatial light modulator 32. Thus, each hardened layer of the model can be formed at high speed and with high precision, and a high-resolution three-dimensional model can be formed in a short time by accumulating the hardened layers. Specifically, when each desired hardened layer is formed, in the large portion that can be blanket-exposed, the hardened layer is formed in a short time using the light that is spatially modulated by the spatial light modulator 32. In the boundary portions and portions close to the boundary portions, where high precision is required, the hardened layer is formed with high precision by the light beam that is scanned by the sectioning device 12. Thus each hardened layer of the model can be formed at high speed and with high precision, and a high-strength three-dimensional model can be formed in a short time by accumulating the hardened layers.

In addition to the first light source 11, the scanning device 12, the second light source 31, and the spatial light modulator 32, the optical modeling apparatus 1 according to the embodiment of the present invention includes the moving section 6, which changes the relative positions of the moving platform 4 and the optical system 5 by moving one of the optical system 5 and the moving platform 4 within a plane that is parallel to the liquid surface. This makes it possible to form, at high speed and with high precision, a hardened layer that is larger than the working region that is determined by the performance of the scanning device 12 and the spatial light modulator 32. A comparatively large three-dimensional model can thus be formed, with high resolution and in a short time, by accumulating the individual hardened layers. That is, the so-called step-and-repeat operation is performed. The step-and-repeat operation repeats a sequence of two operations. One operation uses the light beam that is scanned by the scanning device 12 and the light that is spatially modulated by the spatial light modulator 32 to form segmented portions of the desired two-dimensional shape in individual working regions. The other operation uses the moving section 6 to change the relative positions of the moving platform 4 and the optical system 5. This makes it possible to form, at high speed and with high precision, a hardened layer that is larger than the working region that is determined by the performance of the scanning device 12 and the spatial light modulator 32. A comparatively large three-dimensional model can thus be formed, with high resolution and in a short time, by accumulating the individual hardened layers.

Note that the optical modeling apparatus that uses the present invention is not limited to this example. For example, a high-speed polarizing element may be provided that polarizes at high speed a light beam that passes through a beam scanning optical system.

Figure 13:
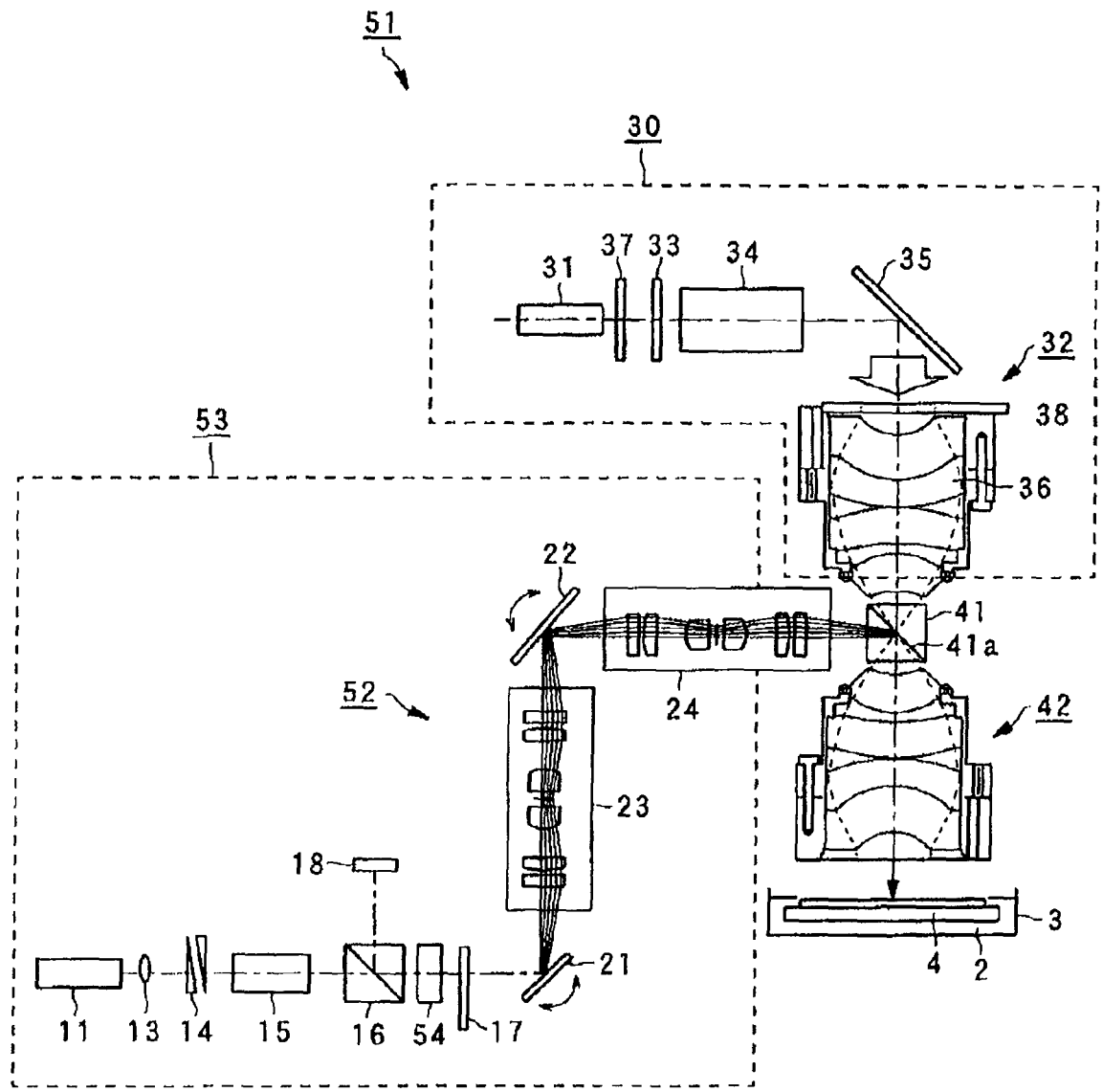
FIG. 13 is a figure that shows an optical system that has a high-speed polarizing element as another example of the optical system of the optical modeling apparatus according to the embodiment of the present invention.

Next, an optical modeling apparatus will be explained that is provided with the high-speed polarizing element in the beam scanning optical system, as shown in FIG. 13. Note that in the explanation that follows, the same reference numerals are used for portions that are common to the optical modeling apparatus 1, and detailed explanations are omitted.

The optical modeling apparatus 51 according to the embodiment of the present invention, as shown in FIG. 13, includes the first light source 11 for a beam scanning optical system 53 and a scanning device 52 that causes the light beam that is emitted by the first light source 11 to scan over the ultraviolet-curable resin 2. The blanket exposure optical system 30 includes the second light source 31, the spatial light modulator 32. The beam splitter 41 that combines the light paths is also provided.

In addition to the first light source 11 and the scanning device 52, the beam scanning optical system 53 of the optical modeling apparatus 51 includes the collimator lens 13, the anamorphic lens 14, and the beam expander 15. Furthermore, the beam splitter 16, which guides the returning light to the reflected light detector 18, and the shutter 17 are provided between the beam expander 15 and the first galvano-mirror 21. Between the beam splitter 16 and the shutter 17, the scanning device 52 also includes the first and second galvano-mirrors 21, 22, the first and second relay lenses 23, 24, and the objective lens 42. In addition, a high-speed polarizing element 54 that polarizes at high speed the incident light beam that passes through it is provided between the beam splitter 16 and the shutter 17 as an element of the scanning device 52.

An acoustic optical deflector, an electro-optic deflector, or the like can be used as the high-speed polarizing element 54. The acoustic optical deflector utilizes the acousto-optic effect to change the polarized direction of the light beam that passes through it. The electro-optic deflector utilizes an electro-optic effect to change the polarized direction of the light beam that passes through it. The high-speed polarizing element 54 is more suitable than are the first and second galvano-mirrors 21, 22 for a so-called fill-in scanning operation that is used for scanning the interval portion $a_{22}$, as shown in FIG. 9, and the like. The high-speed polarizing element 54 thus makes high-speed precision plotting possible.

The scanning device 52 that has the high-speed polarizing element 54 uses the first and second galvano-mirrors 21, 22 to do vector scanning of the boundary portion $a_{21}$ shown in FIG. 9, and uses the high-speed polarizing element 54 to do the raster scanning of the interval portion $a_{22}$ shown in FIG. 9, thus forming the precision portion of the hardened layer.

In this process, the high-speed polarizing element 54 can scan the ultraviolet-curable resin 2 at a higher speed than can the first and second galvano-mirrors 21, 22 and can thus increase the plotting speed of the beam scanning optical system 53, which takes more time than does the blanket exposure optical system 30. The high-speed polarizing element 54 thus makes it possible to shorten the modeling time of the optical modeling apparatus 51.

The beam scanning optical system 53 is thus configured from the first light source 11, the collimator lens 13, the anamorphic lens 14, the beam expander 15, and the scanning device 52, which includes the first and second galvano-mirrors 21, 22, the first and second relay lenses 23, 24, the objective lens 42, and the high-speed polarizing element 54. The beam scanning optical system 53 of the optical modeling apparatus 51 focuses the light beam on and scans it over the desired position on the ultraviolet-curable resin 2, switching between polarization that uses the first and second galvano-mirrors 21, 22 to scan in the X direction and the Y direction, in the same manner as the beam scanning optical system 10, and polarization that uses the high-speed polarizing element 54 to scan at high speed in the X direction and the Y direction. The beam scanning optical system 53 thus irradiates and plots a precise region to form the hardened layer.

The optical modeling apparatus 51 according to the embodiment of the present invention includes the first light source 11, the scanning device 52, the second light source 31, the spatial light modulator 32, in the same manner as the optical modeling apparatus 1 described above. The optical modeling apparatus 51 forms each hardened layer by hardening the light-curable resin, using the light beam that is scanned by the scanning device 52 and the light that is spatially modulated by the spatial light modulator 32. Thus the optical modeling apparatus 51 can form each hardened layer of the model at high speed and with high precision, and a high-resolution three-dimensional model can be formed in a short time by accumulating the hardened layers. Specifically, when each desired hardened layer is formed, in the large portion that can be blanket-exposed, the hardened layer is formed in a short time using the light that is spatially modulated by the spatial light modulator 32. In the boundary portions and portions close to the boundary portions, where high precision is required, the hardened layer is formed with high precision by the light beam that is scanned by the sectioning device 52. Thus each hardened layer of the model can be formed at high speed and with high precision, and a high-resolution three-dimensional model can be formed in a short time by accumulating the hardened layers. The optical modeling apparatus 51 can also achieve the same effects as those explained above for the optical modeling apparatus 1 by alternating the movement direction of the exposure position adjuster 39 for each hardened layer, by performing the step-and-repeat operation, and the like.

Furthermore, because the optical modeling apparatus 51 according to the embodiment of the present invention has the high-speed polarizing element 54 in addition to the first and second galvano-mirrors 21, 22, it can shorten the time required for the beam scanning optical system 53 to form the hardened layer. For example, among the portions where the scanning device 52 performs precision plotting, in the portions where vector scanning is performed, such as the boundary portions and the like, the scanning device 52 performs the scanning using the first and second galvano-mirrors 21, 22 to polarize the light beam. In the portions where raster scanning is performed, such as the interval portions and the like close to the boundary portions, the scanning device 52 performs the scanning using the high-speed polarizing element 54 to polarize the light beam at high speed. Thus each hardened layer of the model can be form with high precision and at even higher speed.

Note that the optical modeling apparatuses 1, 51 are configured such that the upper surface of the moving platform 4, or the upper surface of the uppermost hardened layer among the hardened layers that are already accumulated, is positioned below the liquid surface of the ultraviolet-curable resin 2 by a distance that corresponds to the thickness of one hardened layer. This is accomplished by moving the moving platform 4 in the vertical direction Z within the reservoir 3, for example, and ensures that the ultraviolet-curable resin 2 that is to be hardened is located in the working region. However, the optical modeling apparatuses 1, 51 according to the present invention are not limited to this configuration. For example, a transparent plate may be provided that is separated from the upper surface of the moving platform 4, or from the upper surface of the uppermost hardened layer, by a distance that corresponds to the thickness of one hardened layer. The transparent plate would exhibit a liquid surface restraining function that restrains the liquid surface of the ultraviolet-curable resin 2. The interval between the transparent plate and the moving platform 4, or between the transparent plate and the upper surface of the uppermost hardened layer, would function as the working region, and the ultraviolet-curable resin 2 that is to be hardened would be located in the interval. The optical modeling apparatuses 1, 51 according to the present invention may also be provided with a plurality of rotating bodies, such as rollers or the like, to the surfaces of which the ultraviolet-curable resin 2 would applied and held. The rotating bodies would then be used by a so-called recoater or the like to provide a stable supply of the ultraviolet-curable resin 2, at a specified thickness, to the moving platform 4 or the upper surface of the uppermost hardened layer, thus supplying the ultraviolet-curable resin 2 to the working region.

Next, an optical modeling method that is used by the optical modeling apparatus 1 will be explained. Note that an optical modeling method that is used by the optical modeling apparatus 51 that was explained using FIG. 13 is the same as that used by the optical modeling apparatus 1, except for the use of the high-speed polarizing element 54 for plotting by the beam scanning optical system 53, so a detailed explanation is omitted.

Based on the three-dimensional shape data that is input by an input section, the optical modeling method that is used by the optical modeling apparatus 1 according to the embodiment of present invention irradiates with light the ultraviolet-curable resin 2 that serves as the liquid light-curable resin, sequentially forming the hardened layers such that the model of the desired shape is formed.

Figure 14:
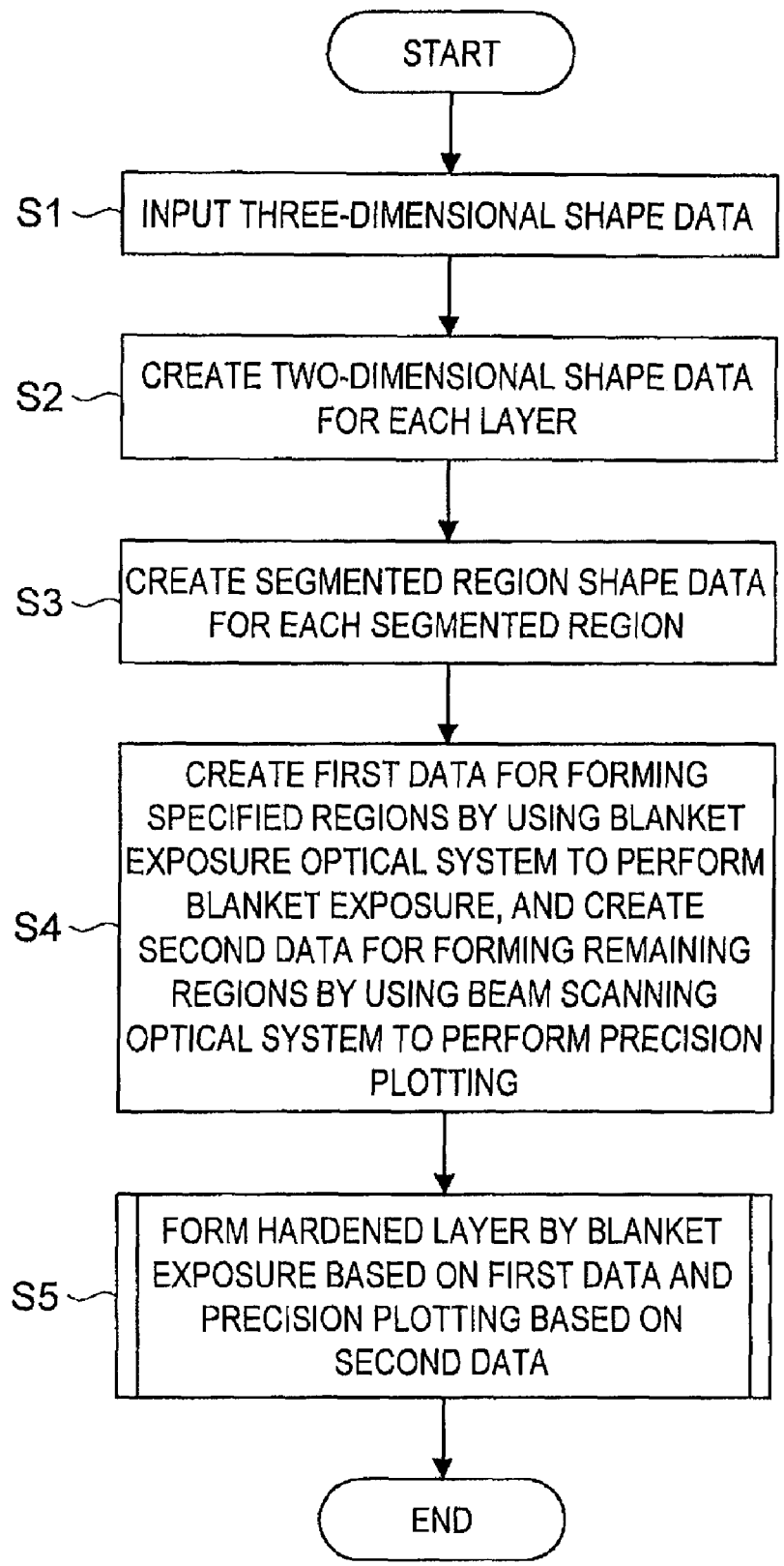
FIG. 14 is a flowchart that explains a modeling method according to the embodiment of the present invention.

The optical modeling method, as shown in FIG. 14, includes Step S1, Step S2, Step S3, Step S4, and Step S5. Step S1 inputs the three-dimensional shape data from the input portion 102. Step S2 creates two-dimensional shape data for each layer, based on the three-dimensional shape data that was input. Based on the created two-dimensional shape data, Step S3 creates segmented region shape data for each of a plurality of the segmented regions that segment each layer within a plane that is parallel to the liquid surface. Based on the created segmented region shape data, Step S4 creates a first data and a second data. The first data is used to form the specified regions by blanket exposure by the blanket exposure optical system 30. The second data is used to form the remaining regions by precision plotting by the beam scanning optical system 10. Step S5 sequentially forms the hardened layer by using the blanket exposure optical system 30 to perform blanket exposure based on the first data and by using the beam scanning optical system 10 to perform precision plotting based on the second data, such that each of the segmented regions $W_{xy}$ is formed.

At Step S1, the three-dimensional shape data, which is CAD data or the like for the target three-dimensional model of the desired shape, is input by the input portion 102 to the data processing and control portion 101 of the data processing and control device 100.

At Step S2, the three-dimensional shape data that was input is converted to three-dimensional shape data in the STL format or the like, for example. The three-dimensional shape data is then sliced into cross sections in the Z direction, which is the layering direction, to create the two-dimensional shape data for each layer. Note that in this process, the method may be structured such that the operation portion 103 can select the position and orientation in which the three-dimensional model is disposed, the layering direction, and the thickness in the layering direction.

At Step S3, the created two-dimensional shape data is segmented, based on the created two-dimensional shape data, into the segmented regions that correspond to each of the specified 1 cm×1 cm working regions $W_{xy}$ described above, creating the segmented region shape data, which is the two-dimensional shape data $f_{xy}$ for each of the working regions $W_{xy}$.

At Step S4, the first data and the second data are created, based on the segmented region shape data produced for each of the working regions $W_{xy}$. The first data is used to form the specified regions by blanket exposure (that is, by using the spatial light modulator 32 to perform the blanket exposure of one fixed region on the ultraviolet-curable resin 2 at a time such that the blanket-plotted portion, which is the specified region of the hardened layer, is formed). The second data is used to form the remaining regions by precision plotting by the beam scanning optical system 10 (that is, by using the scanning device 12 to scan the light beam over the ultraviolet-curable resin 2 such that the precision-plotted portions, which are the remaining regions of the hardened layer, are formed).

Note that in Steps 3 and 4, explained above, the first data and the second data are created, based on the segmented region shape data, after the segmented region shape data is created from the two-dimensional shape data, but the optical modeling method is not limited to this example. For example, the optical modeling method may be performed such that the segmented region shape data is created after the first data and the second data are created based on the two-dimensional shape data. The first data is used to form the blanket-plotted portions that are the specified regions that are blanket-exposed by the blanket exposure optical system 30. The second data is used to form the precision-plotted portions that form the remaining regions by the precision plotting by the beam scanning optical system 10.

Figure 15:
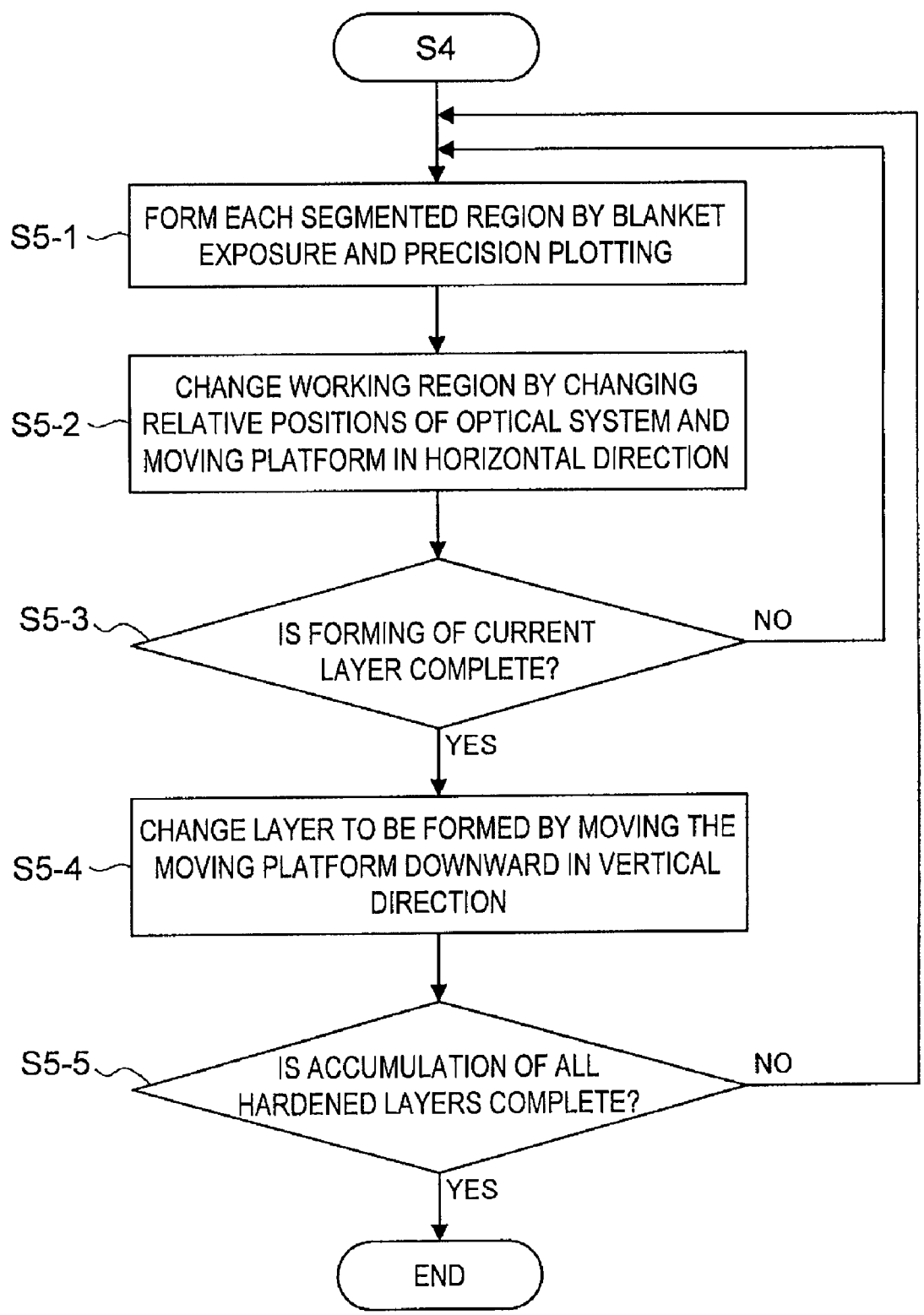
FIG. 15 is a flowchart that explains in greater detail a Step S5 shown in FIG. 14 where the hardened layer is formed.

Step S5, as shown in FIG. 15, includes Step S5-1, Step S5-2, Step S5-3, Step S5-4, and Step S5-5. For each of the working regions $W_{xy}$, Step S5-1 uses the light that is spatially modulated by the spatial light modulator 32 to perform the blanket exposure of the specified region on the ultraviolet-curable resin 2 based on the first data. Step S5-1 also uses the light beam that is scanned by the scanning device 12 to scan the ultraviolet-curable resin 2 based on the second data. Thus Step S5-1 forms the segmented portion of the hardened layer. Step S5-2 uses the moving section 6 to change the relative positions of the moving platform 4 and the optical system 5, thus changing the working region $W_{xy}$. Step S5-3 confirms that the forming of each segmented region in the layer has been completed. When the hardened layer of the specified height has been formed, Step S5-4 changes the layer to be formed by moving the position of the moving platform 4 in the Z direction downward. Step S5-5 confirms that the accumulation of all of the hardened layers has been completed.

At Step S5-1, the first light source 11 emits the light beam that will do the plotting on the ultraviolet-curable resin 2, and the scanning device 12 scans the light beam emitted by the first light source 11. The second light source 31 emits the light that will irradiate the ultraviolet-curable resin 2 one fixed region at a time, and the spatial light modulator 32 spatially modulates the light that is emitted by the second light source 31. The scanning device 12 scans the scanned light beam over the ultraviolet-curable resin 2. The light that is spatially modulated by the spatial light modulator 32, and moved by the exposure position adjuster 39 only the specified distance that is the fixed region and is not greater than the distance that corresponds to one pixel, is used to perform the blanket exposure of the specified region on the ultraviolet-curable resin 2. Thus the ultraviolet-curable resin 2 is hardened in each of the segmented regions, and the segmented regions of each hardened layer of the model are formed.

At Step S5-2, the moving section 6 moves the moving platform 4 in the X direction and/or the Y direction, thus setting the working region $W_{xy}$ in a position that is in accordance with the segmented region shape data.

At Step S5-3, the optical modeling apparatus 1 checks whether or not the forming of all of the segmented regions in the layer has been completed. If the forming of the segmented regions has not been completed, the processing returns to Step S5-1 and repeats Step S5-1 and Step S5-2. If the forming of all of the segmented regions in the layer has been completed, the processing proceeds to Step S5-4.

At Step S5-4, the moving platform 4 is moved downward in the Z direction such that the working region $W_{xy}$ is moved into position for forming the next hardened layer, thus changing the layer to be formed.

At Step S5-5, the optical modeling apparatus 1 checks whether or not the accumulation of all of the hardened layers of the three-dimensional model has been completed. If the accumulation of all of the hardened layers of the three-dimensional model has not been completed, the processing returns to Step S5-1 and repeats Steps S5-1 to S5-4.

Thus at Step S5, as explained for Steps S5-1 to S5-3 above, the blanket exposure optical system 30, based on the first data, performs the blanket exposure of each of the working regions $W_{xy}$ in the layer of the specified height, and the beam scanning optical system 10 performs the precision plotting, based on the second data, to form the segmented regions of the hardened layer. All of the segmented regions within the layer are formed, based on the two-dimensional shape data, by sequentially changing the working region. When one hardened layer is produced, the height in the vertical direction Z is changed, and the process is repeated sequentially to form the three-dimensional model.

Note that in the optical modeling method described above, Step S3 may be omitted in such cases as where the moving section 6 is not provided or where the size in the planar direction of the three-dimensional model to be modeled is so small as to be contained with the specified working region. In these cases, the two-dimensional shape data created at Step S2 serves as the segmented region shape data in Steps 4 and 5, and Steps S5-2 and S5-3 in Step S5 are not performed.

Thus, in the optical modeling method according to the embodiment of present invention, the first light source 11 emits the light beam that will do the plotting on the ultraviolet-curable resin 2, and the scanning device 12 scans the light beam emitted by the first light source 11. The second light source 31 emits the light that will irradiate the ultraviolet-curable resin 2 one fixed region at a time, and the spatial light modulator 32 spatially modulates the light that is emitted by the second light source 31. The scanning device 12 scans the scanned light beam over the ultraviolet-curable resin 2. The light that is spatially modulated by the spatial light modulator 32 is used to perform the blanket exposure of the specified region on the ultraviolet-curable resin 2. Thus each hardened layer of the model is formed. Thus, when each desired hardened layer is formed, in the large portion that can be blanket-exposed, the hardened layer is formed in a short time using the light that is spatially modulated by the spatial light modulator 32. In the boundary portions and portions close to the boundary portions, where high precision is required, the hardened layer is formed with high precision by the light beam that is scanned by the sectioning device 12. Thus each hardened layer of the model can be formed at high speed and with high precision, and the high-resolution three-dimensional model can be formed in a short time by accumulating the hardened layers.

The optical modeling method according to the embodiment of present invention is an optical modeling method that forms the model of the desired shape by irradiating the ultraviolet-curable resin 2 based on the three-dimensional shape data that is input by the input portion 102, such that the hardened layers are formed sequentially. The optical modeling method includes Step S1, Step S2, Step S4, and Step S5. Step S1 inputs the three-dimensional shape data from the input portion 102. Step S2 creates the two-dimensional shape data for each layer, based on the three-dimensional shape data that was input. Based on the created two-dimensional shape data, Step S4 creates the first data and the second data. The first data is used to form the specified regions of the hardened layer by using the spatial light modulator 32 to blanket-expose one fixed region of the ultraviolet-curable resin 2 at a time. The second data is used to form the remaining regions of the hardened layer by using the scanning device 12 to scan the light beam over the ultraviolet-curable resin 2. Step S5 sequentially forms the hardened layer by blanket-exposing the specified regions of the ultraviolet-curable resin 2 to the light that is spatially modulated by the spatial light modulator 32 based on the first data, and by using the scanning device 12 to scan the light beam over the ultraviolet-curable resin 2, based on the second data. Each hardened layer of the model can thus be formed at high speed and with high precision, and the sequential accumulation of the hardened layers makes it possible to form the high-resolution three-dimensional model in a short time.

Furthermore, in the optical modeling method that is an application of the present invention, the hardened layers are sequentially formed by irradiating the ultraviolet-curable resin 2 with light based on the three-dimensional shape data that is input from the input portion 102. The optical modeling method thus forms the model of the desired shape on the moving platform 4 that is immersed in the ultraviolet-curable resin 2 and is moved in at least the direction that is orthogonal to the liquid surface of the ultraviolet-curable resin 2. The optical modeling method includes Step S1, Step S2, Step S3, Step S4, and Step S5. Step S1 inputs the three-dimensional shape data from the input portion 102. Step S2 creates the two-dimensional shape data for each layer, based on the three-dimensional shape data that was input. Based on the two-dimensional shape data for each layer, Step S3 creates the segmented region shape data for each of the plurality of the segmented regions that segment each layer within a plane that is parallel to the liquid surface. Based on the segmented region shape data, Step S4 creates the first data and the second data. The first data is used to form the specified segmented regions of the hardened layer by using the spatial light modulator 32 to blanket-expose one fixed region of the ultraviolet-curable resin 2 at a time. The second data is used to form the remaining segmented regions of the hardened layer by using the scanning device 12 to scan the light beam over the ultraviolet-curable resin 2. Step S5 forms each segmented region by blanket-exposing the specified regions of the ultraviolet-curable resin 2 to the light that is spatially modulated by the spatial light modulator 32, based on the first data, and by using the scanning device 12 to scan the light beam over the ultraviolet-curable resin 2, based on the second data. Step S5 also changes the working region by changing the positional relationship of the spatial light modulator 32 and the scanning device 12 to the moving platform 4 within the plane that is parallel to the liquid surface, thus forming and accumulating the hardened layers sequentially. Each segmented region of each hardened layer of the model can thus be formed at high speed and with high precision, making it possible to form the model at high speed and with high precision. Moreover, sequentially accumulating the hardened layers makes it possible to form the comparatively large three-dimensional model with high precision in a short time.

It should be understood by those skilled in the art that various modifications, combinations, sub-combinations and alterations may occur depending on design requirements and other factors insofar as they are within the scope of the appended claims or the equivalents thereof.

What is claimed is:

1. An optical modeling apparatus that forms a model of a desired shape by sequentially forming hardened layers by irradiating a light-curable resin with light, the optical modeling apparatus comprising:
   a first light source that emits a light beam for plotting on the light-curable resin;
   a scanning device that scans the light beam emitted by the first light source over the light-curable resin;
   a second light source that emits light that irradiates one fixed region of the light-curable resin at a time; and
   a spatial light modulator that spatially modulates the light emitted by the second light source to perform a blanket exposure of a specified region of the light-curable resin,
   wherein each of the hardened layers of the model is formed by the light beam that is scanned by the scanning device and by the light that is spatially modulated by the spatial light modulator.

2. The optical modeling apparatus according to claim 1, wherein each hardened layer of the model is formed by one of simultaneous emission of at least one of the light beam that is scanned by the scanning device and the light that is spatially modulated by the spatial light modulator.

3. The optical modeling apparatus according to either claim 1 or 2, further comprising:
   a light path combiner that combines the light beam that is scanned by the scanning device and the light that is spatially modulated by the spatial light modulator and guides the combined light onto the light-curable resin.

4. The optical modeling apparatus according to claim 1, wherein the scanning device includes
   a first galvano-mirror that polarizes the incident light beam and scans the light beam that is emitted by the first light source in a first direction within a plane that is parallel to a surface of the light-curable resin,
   a second galvano-mirror that polarizes the light beam from the first galvano-mirror and scans the light beam in a second direction that is roughly orthogonal to the first direction within the plane, and
   an objective lens that focuses the light beam from the second galvano-mirror.

5. The optical modeling apparatus according to claim 4, wherein
   the objective lens is an fθ lens that has a relationship such that an image height is equal to a product of a focal length and an incidence angle, and
   the objective lens, in addition to focusing the light beam from the second galvano-mirror, scans the light beam that is polarized by the first and second galvano-mirrors over the light-curable resin at a constant speed.

6. The optical modeling apparatus according to claim 4, further comprising:
   a light path combiner that combines the light beam that is scanned by the scanning device and the light that is spatially modulated by the spatial light modulator and guides the combined light onto the light-curable resin, wherein
   the objective lens is disposed between the light path combiner and the light-curable resin,
   the scanning device includes
      a first relay lens that is provided between the first galvano-mirror and the second galvano-mirror, and
      a second relay lens that is provided between the second galvano-mirror and the light path combiner,
   the second relay lens guides the light beam that is polarized by the second galvano-mirror to pass through a front focal position of the objective lens, and
   the first relay lens guides the light beam that is polarized by the first galvano-mirror to pass through the front focal position of the objective lens by way of the second galvano-mirror and the second relay lens.

7. The optical modeling apparatus according to claim 4, further comprising:
   a light path combiner that combines the light beam that is scanned by the scanning device and the light that is spatially modulated by the spatial light modulator and guides the combined light onto the light-curable resin; and
   a condenser lens that is provided between the spatial light modulator and the light path combiner and that, together with the objective lens, forms the light that is spatially modulated by the spatial light modulator into an image on the light-curable resin.

8. The optical modeling apparatus according to claim 7, wherein the condenser lens counterbalances distortion when the light from the spatial light modulator passes through the objective lens.

9. The optical modeling apparatus according to claim 1, wherein the spatial light modulator is a transmissive liquid crystal element.

10. The optical modeling apparatus according to claim 1, further comprising:
    a moving platform that carries the hardened layers and is moved in at least a direction that is orthogonal to a surface of the light-curable resin;
    an optical system that includes at least the first light source, the scanning device, the second light source, and the spatial light modulator; and
    a moving section that, by moving one of the moving platform and the optical system in a plane that is parallel to the surface of the light-curable resin, changes relative positions of the moving platform and the optical system, wherein the hardened layers are formed in the specified region by irradiating the specified region with the light beam and the light, and each of the hardened layers of the model of the desired shape is formed by using the moving section to sequentially change the relative positions of the moving platform and the optical system.

11. The optical modeling apparatus according to claim 10, further comprising:

a processing portion that creates two-dimensional shape data for each layer based on three-dimensional shape data that is input, and that creates segmented region shape data for each of a plurality of segmented regions that segment each layer within the plane that is parallel to the surface of the light-curable resin, wherein the hardened layers are formed in each segmented region by irradiating the segmented region with the light beam and the light, based on the segmented region shape data.

12. The optical modeling apparatus according to claim 1, wherein a blanket-plotted portion of a hardened layer of the light-curable resin is formed by using the light that is spatially modulated by the spatial light modulator to perform a rough plotting of a portion of an interior of the desired shape of each layer to produce the model of the desired shape, and a precision-plotted portion of the hardened layer of the light-curable resin is formed by using the light beam that is scanned by the scanning device to perform a precision plotting of a boundary portion of the desired shape of each layer and an interval portion between the boundary portion and the blanket-plotted portion.

13. The optical modeling apparatus according to claim 12, wherein the scanning device includes a first galvano-mirror that polarizes the incident light beam and scans the light beam that is emitted by the first light source in a first direction within a plane that is parallel to a surface of the light-curable resin, a second galvano-mirror that polarizes the light beam from the first galvano-mirror and scans the light beam in a second direction that is roughly orthogonal to the first direction within the plane, and a polarizing element that polarizes the light beam that passes through it, and the scanning device forms the precision-plotted portion of the hardened layer by using the first galvano-mirror and the second galvano-mirror to perform vector scanning of the boundary portion and by using the polarizing element to perform raster scanning of the interval portion.

14. The optical modeling apparatus according to claim 10, wherein the scanning device includes a reflected light detector that detects the light beam that is emitted onto and reflected by the light-curable resin, and the optical modeling apparatus performs a focus correction for at least one of each hardened layer and each specified region.

15. The optical modeling apparatus according to claim 1, wherein the scanning device includes a reflected light detector that detects the light beam that is emitted onto and reflected by the light-curable resin, and the optical modeling apparatus detects a hardened portion and an unhardened portion of the light-curable resin.

16. The optical modeling apparatus according to claim 1, wherein the light-curable resin is a liquid ultraviolet-curable resin.

* * * * *